United States Patent
Mun et al.

(10) Patent No.: US 11,450,554 B2
(45) Date of Patent: Sep. 20, 2022

(54) METHOD OF FORMING MATERIAL FILM, INTEGRATED CIRCUIT DEVICE, AND METHOD OF MANUFACTURING THE INTEGRATED CIRCUIT DEVICE

(71) Applicant: Samsung Electronics Co., Ltd., Suwon-si (KR)

(72) Inventors: Geumbi Mun, Suwon-si (KR); Jinyong Kim, Hwaseong-si (KR); Junwon Lee, Asan-si (KR); Kwangtae Hwang, Seoul (KR); Iksoo Kim, Yongin-si (KR); Jiwoon Im, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 87 days.

(21) Appl. No.: 17/003,304

(22) Filed: Aug. 26, 2020

(65) Prior Publication Data
US 2021/0193508 A1    Jun. 24, 2021

(30) Foreign Application Priority Data
Dec. 20, 2019   (KR) .................. 10-2019-0171894

(51) Int. Cl.
*H01L 21/62*    (2006.01)
*H01L 21/02*    (2006.01)
*H01L 21/762*   (2006.01)
*H01L 27/108*   (2006.01)

(52) U.S. Cl.
CPC .... *H01L 21/76224* (2013.01); *H01L 21/0228* (2013.01); *H01L 21/76229* (2013.01); *H01L 27/10879* (2013.01); *H01L 21/0234* (2013.01); *H01L 21/02126* (2013.01); *H01L 21/02164* (2013.01); *H01L 21/02205* (2013.01); *H01L 21/02211* (2013.01)

(58) Field of Classification Search
None
See application file for complete search history.

(56) References Cited

U.S. PATENT DOCUMENTS

| | | |
|---|---|---|
| 6,399,208 B1 | 6/2002 | Baum et al. |
| 9,257,274 B2 | 2/2016 | Kang et al. |
| 9,945,028 B2 | 4/2018 | Shimizu |
| 10,103,029 B2 | 10/2018 | Richardson et al. |
| 10,246,774 B2 | 4/2019 | Cleemput |
| 2017/0114459 A1 | 4/2017 | Saly et al. |
| 2019/0206731 A1 | 7/2019 | Chandrashekar et al. |
| 2020/0395211 A1* | 12/2020 | Jia ............... H01L 21/3065 |
| 2021/0123143 A1* | 4/2021 | Fenwick ......... C23C 16/45529 |

* cited by examiner

*Primary Examiner* — Asok K Sarkar
(74) *Attorney, Agent, or Firm* — Muir Patent Law, PLLC

(57) ABSTRACT

To manufacture an integrated circuit (IC) device, a lower structure having a step structure defining a trench is prepared. A material film is formed inside the trench. To form a material film, a first precursor including a first central element and a first ligand having a first size is supplied onto a lower structure to form a first chemisorbed layer of the first precursor on the lower structure. A second precursor including a second central element and a second ligand having a second size less than the first size is supplied onto a resultant structure including the first chemisorbed layer to form a second chemisorbed layer of the second precursor on the lower structure. A reactive gas is supplied to the first chemisorbed layer and the second chemisorbed layer.

20 Claims, 22 Drawing Sheets

METHOD OF FORMING MATERIAL FILM, INTEGRATED CIRCUIT DEVICE, AND METHOD OF MANUFACTURING THE INTEGRATED CIRCUIT DEVICE

CROSS-REFERENCE TO RELATED APPLICATION

This application claims the benefit of priority to Korean Patent Application No. 10-2019-0171894, filed on Dec. 20, 2019, in the Korean Intellectual Property Office, the disclosure of which is incorporated herein in its entirety by reference.

BACKGROUND

The inventive concept relates to a method of forming a material film, an integrated circuit (IC) device, and a method of manufacturing the IC device, and more particularly, to a method of forming a material film using an atomic layer deposition (ALD) process, an IC device including the material film obtained using the method, and a method of manufacturing the IC device.

As electronic devices become highly integrated and downscaled, an aspect ratio of patterns included in the electronic devices gradually increases. Accordingly, there is a need for a deposition technique for providing good gap-fill characteristics even in a narrow and deep space having a high aspect ratio. In particular, to perform an atomic layer deposition (ALD) process for forming a material film on a three-dimensional (3D) structure including a deep and narrow trench to fill the trench, it is useful to develop a deposition technique capable of forming the material film inside the trench without causing seams or voids.

SUMMARY

Various aspects of the inventive concept provide a method of forming a material film, by which a material film having no seams or voids may be formed on a three-dimensional (3D) structure including a trench, which is deep and narrow, to fill the trench.

Aspects of the inventive concept also provide a method of manufacturing an integrated circuit (IC) device, which includes a process of forming a material film on a 3D structure including a trench, which is deep and narrow, to fill the trench without forming seams or voids in the material film.

Furthermore, aspects of the inventive concept provide a method of manufacturing an IC device including a material film that may fill a deep and narrow trench formed in a 3D structure without seams or voids and provide excellent electrical characteristics.

According to an aspect of the inventive concept, there is provided a method of forming a material film. The method includes supplying a first precursor including a first central element and a first ligand having a first size onto a lower structure and forming a first chemisorbed layer of the first precursor on the lower structure. A second precursor including a second central element and a second ligand having a second size is supplied onto a resultant structure in which the first chemisorbed layer is formed, and thus, a second chemisorbed layer of the second precursor is formed on the lower structure. The second size is less than the first size. A material film comprising the first central element and the second central element is formed by supplying a reactive gas to the first chemisorbed layer and the second chemisorbed layer to remove the first ligand and the second ligand from the lower structure.

According to another aspect of the inventive concept, there is provided a method of manufacturing an IC device. The method includes preparing a lower structure having a step structure defining a trench. A material film is formed inside the trench. The formation of the material film includes performing an atomic layer deposition (ALD) cycle at least once. The ALD cycle includes a first process of supplying a first precursor including a first central element and a first ligand having a first size into the trench and forming a first chemisorbed layer of the first precursor inside the trench, a second process of supplying a second precursor including a second central element and a second ligand having a second size less than the first size into the trench in which the first chemisorbed layer is formed, and forming a second chemisorbed layer of the second precursor inside the trench, and a third process of forming an atomic-level material film comprising the first central element and the second central element inside the trench by supplying a reactive gas to the first chemisorbed layer and the second chemisorbed layer.

According to another aspect of the inventive concept, there is provided a method of manufacturing an IC device. The method includes forming a trench defining an active region in a substrate. A silicon oxide film is formed inside the trench. The formation of the silicon oxide film includes performing an ALD cycle at least once. The ALD cycle includes a first process of supplying a first precursor including a first silicon (Si) central element and a first ligand having a first size into the trench and forming a first chemisorbed layer of the first precursor inside the trench, a second process of supplying a second precursor including a second silicon central element and a second ligand having a second size less than the first size into the trench in which the first chemisorbed layer is formed, and forming a second chemisorbed layer of the second precursor inside the trench, and a third process of forming an atomic-level silicon oxide film inside the trench by supplying an oxidizing gas to the first chemisorbed layer and the second chemisorbed layer.

According to another aspect of the inventive concept, there is provided an IC device formed using the method of manufacturing the IC device according to one aspect of the inventive concept. The IC device includes a material film filling a trench, and the material film includes a silicon oxide film. An upper portion of the silicon oxide film, which is relatively close to an entrance of the trench, includes carbon atoms at a first content. A lower portion of the silicon oxide film, which is relatively close to a bottom surface of the trench, includes carbon atoms at a second content lower than the first content.

According to another aspect of the inventive concept, there is provided an IC device manufactured using the method of manufacturing the IC device according to another aspect of the inventive concept. The IC device includes a silicon oxide film filling a trench. The silicon oxide film has a carbon atom content of less than 3 atomic percent (at %). An upper portion of the silicon oxide film, which is relatively close to an entrance of the trench, includes carbon atoms at a first content that is selected in the range of more than 0 at % and less than 3 at %. A lower portion of the silicon oxide film, which is relatively close to a bottom surface of the trench, includes carbon atoms at a second content that is selected in the range of more than or equal to 0 at % and less than 3 at %, and the second content is lower than the first content.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
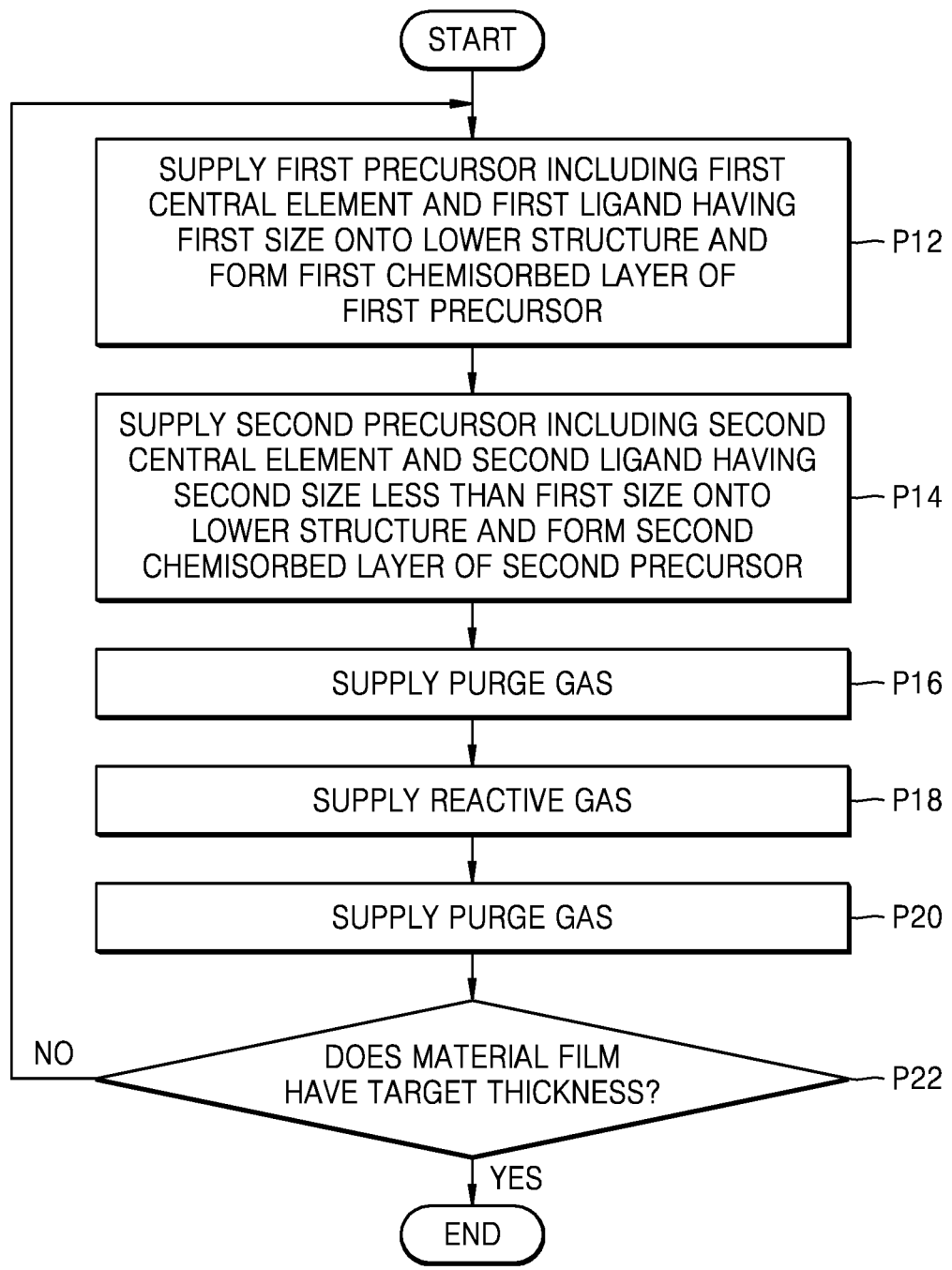
FIG. 1 is a flowchart of a method of forming a material film, according to embodiments.

Hereinafter, embodiments will be described in detail with reference to the accompanying drawings. In the drawings, the size and relative sizes of layers and regions may be exaggerated for clarity. The same reference numerals are used to denote the same or similar elements in the drawings, and repeated descriptions thereof will be omitted.

FIG. 1 is a flowchart of a method of forming a material film, according to embodiments. FIGS. 2A to 2E are cross-sectional views of a process sequence of a method of forming a material film, according to embodiments. The method of forming the material film, according to these embodiments, will now be described with reference to FIGS. 1 and 2A to 2E. In the present embodiment, a method of manufacturing a material film using an atomic layer deposition (ALD) process will be exemplarily described.

Figure 2A:
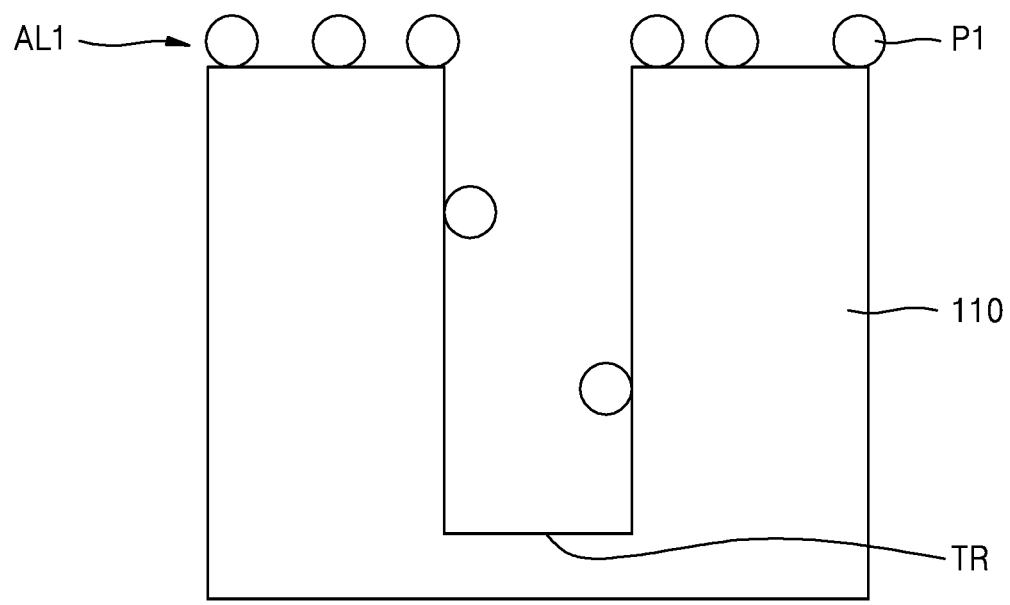
FIGS. 2A to 2E are cross-sectional views of a process sequence of a method of forming a material film, according to embodiments.

Referring to FIGS. 1 and 2A, in process P12, a first precursor P1 may be supplied onto a lower structure 110 in a reaction space, and thus, a first chemisorbed layer AL1 of the first precursor P1 may be formed on the lower structure 110. The first precursor P1 may include a first central element and a first ligand having a first size.

A step structure defining a trench TR may be formed in an upper portion of the lower structure 110. The lower structure 110 may include or may be a semiconductor element, a compound semiconductor, or an insulating material. In example embodiments, the lower structure 110 may include a conductive region (e.g., a doped well or a doped structure), an interconnection layer, a contact plug, and a transistor and further include an insulating film configured to insulate the conductive region, the interconnection layer, the contact plug, and the transistor from each other.

The first size of the first ligand of the first precursor P1 may be greater than a second size of a second ligand of a second precursor P2, which will be described below with reference to process P14 of FIG. 1 and FIG. 2B. In example embodiments, a size of the first precursor P1 may be greater than a size of the second precursor P2, which will be described below with reference to process P14 of FIG. 1 and FIG. 2B. As used herein, a size of a ligand or a precursor refers to a volume of a space occupied by the ligand or the precursor. In example embodiments, a molecular weight of the first precursor P1 may be greater than a molecular weight of the second precursor P2.

In example embodiments, the first ligand of the first precursor P1 may include at least one selected from an aromatic functional group, an alkoxy functional group, a thiol functional group, and a bulky organic functional group. Because the first precursor P1 includes the first ligand having a relatively large size, the first precursor P1 may have a low adsorption density due to steric hindrance. Thus, even after the first precursor P1 is adsorbed on an exposed surface of the lower structure 110, a vacant region on which the first precursor P1 is not adsorbed may remain in and on the exposed surface of the lower structure 110. In addition, the first precursor P1 may have a relatively low flowability, so the first precursor P1 may have difficulty reaching a deep region or a bottom surface of the trench TR and may be mainly adsorbed on a top surface of the lower structure 110 and an upper sidewall of the trench TR that is close to an entrance side of the trench TR. For example, in some embodiments, 80% or more of the first precursor P1 is adsorbed on a top surface of the lower structure 110 and an upper half portion of the sidewall of the trench TR. Because the first precursor P1 is mainly adsorbed on the entrance side of the trench TR, the first precursor P1 may prevent the second precursor P2, which will be described below with reference to process P14 of FIG. 1 and FIG. 2B, from being adsorbed on the entrance side of the trench TR and induce the second precursor P2 to be preferentially adsorbed on the deep region or the bottom surface of the trench TR. The second precursor P2 will be described in detail below with reference to process P14 of FIG. 1 and FIG. 2B.

Figure 2B:
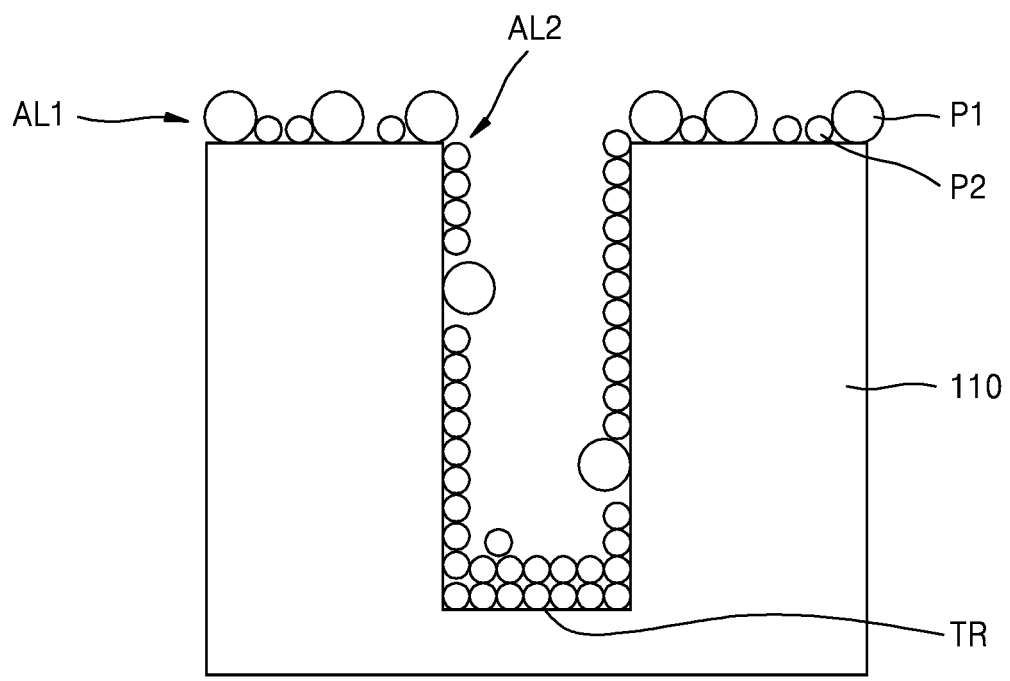

Referring to FIGS. 1 and 2B, in process P14, the second precursor P2 may be supplied onto the resultant structure including the first chemisorbed layer AL1, and thus, a second chemisorbed layer AL2 of the second precursor P2 may be formed on the lower structure 110.

In some embodiments, the second precursor P2 may include or may be formed by a second central element and a second ligand, and the second central element of the second precursor P2 may include or may be formed by the same element as the first central element of the first precursor P1. The second ligand included in the second precursor P2 may have a different structure from the first ligand of the first precursor P1. A second size of the second ligand may be less than the first size of the first ligand. In example embodiments, the first precursor P1 may have a larger size than the second precursor P2. In example embodiments, a molecular weight of the first precursor P1 may be greater than a molecular weight of the second precursor P2. In some other embodiments, the second central element of the second precursor P2 may include a different element from the first central element of the first precursor P1.

The second precursor P2 may have a higher reactivity than the first precursor P1. Accordingly, a deposition rate at which the material film is formed using the second precursor P2 may be higher than a deposition rate at which the material film is formed using the first precursor P1. The second chemisorbed layer AL2 of the second precursor P2 may be formed in a region of the exposed surface of the lower structure 110, which is exposed by the first chemisorbed layer AL1 of the first precursor P1. The first chemisorbed layer AL1 and the second chemisorbed layer AL2, which are obtained from the first precursor P1 and the second precursor P2 having different structures, may be formed on the lower structure 110.

Because the first precursor P1 is mainly adsorbed on the entrance side of the trench TR, when the first precursor P1 is supplied onto the lower structure 110, a large amount of the second precursor P2 having a relatively small size may enter the trench TR. The first precursor P1 adsorbed on the entrance side of the trench TR may induce the second precursor P2 to be adsorbed on the deep region or the bottom surface of the trench TR more preferentially than on the entrance side of the trench TR.

The first chemisorbed layer AL1 of the first precursor P1 having a relatively low adsorption density may be formed on the top surface of the lower structure 110 and the entrance side of the trench TR, while the second chemisorbed layer AL2 of the second precursor P2 having a relatively high adsorption density may be formed on the deep region or the bottom surface of the trench TR. Thus, the material film may be deposited on the top surface of the lower structure 110 and the entrance side of the trench TR at a relatively low deposition rate, while the material film may be deposited on the deep region of the trench TR at a relatively high deposition rate. Accordingly, the inside of the trench TR may be filled with a high purity of the material film without causing voids.

In example embodiments, the first central element of the first precursor P1 may include the same element as the second central element of the second precursor P2. The first central element and the second central element may include or may be silicon (Si), boron (B) or a metal. A metal that may be included in or may form the first central element and the second central element may be selected from zirconium (Zr), lithium (Li), beryllium (Be), sodium (Na), magnesium (Mg), aluminum (Al), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), Lutetium (Lu), hafnium (Hf), tantalum (Ta), tungsten (W), rhenium (Re), osmium (Os), iridium (Ir), platinum (Pt), gold (Au), mercury (Hg), lead (Pb), bismuth (Bi), polonium (Po), radium (Ra), and actinium (Ac), but is not limited thereto.

When each of the first central element of the first precursor P1 and the second central element of the second precursor P2 is silicon (Si), the first ligand of the first precursor P1 may include an aromatic functional group, an alkoxy functional group, a thiol functional group, or a bulky organic functional group, and the second ligand of the second precursor P2 may not include any of the aromatic functional group, the alkoxy functional group, the thiol functional group, or the bulky organic functional group, or may not include any aromatic functional group, alkoxy functional group, thiol functional group, or bulky organic functional group.

Examples of the first precursor P1 having the first ligand including the aromatic functional group may include 5-(bicycloheptenyl)methyldimethoxysilane (BMDS), 5-(bicycloheptenyl)triethoxysilane (BTS), and 5-(bicycloheptenyl)diethoxysilaneacetylene (BDS), but are not limited thereto.

Examples of the first precursor P1 having the first ligand including the alkoxy functional group may include trimethylmethoxysilane ($CH_3$—O—Si—$(CH_3)_3$, abbreviated as TMMS), dimethyldimethoxysilane (($CH_3)_2$—Si—$(OCH_3)_2$, abbreviated as DMDMS), methyltrimethoxysilane (($CH3$-O—$)_3$—Si—$CH_3$, abbreviated as MTMS), phenyltrimethoxysilane ($C_6H_5$—Si—$(OCH_3)_3$, abbreviated as PTMOS), vinyldiethoxysilane, vinyldimethoxysilane, vinyltrimethoxysilane, vinyltriethoxysilane, vinylmethyldimethoxysilane, and vinylmethyldiethoxysilane, but are not limited thereto.

Examples of the first precursor P1 having the first ligand including the thiol functional group may include (3-mercaptopropyl)trimethoxysilane, (3-mercaptopropyl)triethoxysilane, and (3-mercaptopropyl)methyldimethoxysilane.

The bulky organic functional group may include a —Si—$(CH_2)_n$—Si— group (here, n is an integer ranging from 1 to 5). For example, the first precursor P1 having the first ligand including the bulky organic functional group may be selected from a precursor containing a —Si—$CH_2$—Si— group and a precursor containing a —Si—$(CH_2)_2$—Si— group. Examples of the precursor containing the —Si—$CH_2$—Si— group may include $(EtO)_3$Si—$CH_2$—Si$(OEt)_2$H, Me(EtO)$_2$Si—$CH_2$—Si$(OEt)_2$H, Me(EtO)$_2$Si—$CH_2$—Si(OEt)HMe, Me$_2$(EtO)Si—$CH_2$—Si(OEt)$_2$H, (EtO)Me$_2$Si—$CH_2$—Si$(OMe)_2$H, Me$_2$(EtO)Si—$CH_2$—Si(OEt)HMe, $(EtO)_3$Si—$CH_2$—Si(OEt)HMe, $(EtO)_3$Si—$CH_2$—Si(OMe)HMe, Me(MeO)$_2$Si—$CH_2$—Si$(OMe)_2$H, Me(MeO)$_2$Si—$CH_2$—Si(OMe)HMe, Me$_2$(MeO)Si—$CH_2$—Si$(OMe)_2$H, and Me$_2$(EtO)Si—$CH_2$—Si(OMe)HMe. Examples of the precursor containing the —Si—$(CH_2)_2$—Si— group may include $(EtO)_3$Si—$CH_2CH_2$—Si$(OEt)_2$H, Me(EtO)$_2$Si—$CH_2CH_2$—Si$(OEt)_2$H, Me(EtO)$_2$Si—$CH_2CH_2$—Si(OEt)HMe, Me$_2$(EtO)Si—$CH_2CH_2$—Si$(OEt)_2$H, (EtO)Me$_2$Si—$CH_2CH_2$—Si$(OMe)_2$H, Me$_2$(EtO)Si—$CH_2CH_2$—Si(OEt)HMe, $(EtO)_3$Si—$CH_2CH_2$—Si(OEt)HMe, $(EtO)_3$Si—$CH_2CH_2$—Si(OMe)HMe, Me(MeO)$_2$Si—$CH_2CH_2$—Si$(OMe)_2$H, Me(MeO)$_2$Si—$CH_2CH_2$—Si(OMe)HMe, Me$_2$(MeO)Si—$CH_2CH_2$—Si$(OMe)_2$H, and Me$_2$(EtO)Si—$CH_2CH_2$—Si(OMe)HMe. As used herein, the abbreviation "Me" refers to a methyl group, and the abbreviation "Et" refers to an ethyl group.

In example embodiments, the second precursor P2 may include silane ($SiH_4$), disilane ($Si_2H_6$), silane substituted with halogen, organic silane, or organic aminosilane, but is not limited thereto.

The silane substituted with the halogen may be selected from monofluorosilane ($SiFH_3$), difluorosilane ($SiF_2H_2$), trifluorosilane ($SiF_3H$), tetrafluorosilane ($SiF_4$), monofluorodisilane ($Si_2FH_5$), difluorodisilane ($Si_2F_2H_4$), trifluorodisilane ($Si_2F_3H_3$), tetrafluorodisilane ($Si_2F_4H_2$), pentafluorodisilane ($Si_2F_5H$), hexafluorodisilane ($Si_2F_6$), monochlorosilane ($SiClH_3$), dichlorosilane ($SiCl_2H_2$), trichlorosilane ($SiCl_3H$), tetrachlorosilane ($SiCl_4$), monochlorodisilane ($Si_2ClH_5$), dichlorodisilane ($Si_2Cl_2H_4$), trichlorodisilane ($Si_2Cl_3H_3$), tetrachlorodisilane ($Si_2Cl_4H_2$), pentachlorodisilane ($Si_2Cl_5H$), hexachlorodisilane ($Si_2Cl_6$), monobromosilane ($SiBrH_3$), dibromosilane ($SiBr_2H_2$), tribromosilane ($SiBr_3H$), tetrabromosilane ($SiBr_4$), monobromodisilane ($Si_2BrH_5$), dibromodisilane ($Si_2Br_2H_4$), tribromodisilane ($Si_2Br_3H_3$), tetrabromodisilane ($Si_2Br_4H_2$), pentabromodisilane ($Si_2Br_5H$), hexabromodisilane ($Si_2Br_6$), monoiodosilane ($SiIH_3$), diiodosilane ($SiI_2H_2$), triiodosilane ($SiI_3H$), tetraiodosilane ($SiI_4$), monoiododisilane ($Si_2IH_5$), diiododisilane ($Si_2I_2H_4$), triiododisilane ($Si_2I_3H_3$), tetraiododisilane ($Si_2I_4H_2$), pentaiododisilane ($Si_2I_5H$), and hexaiododisilane ($Si_2I_6$), but is not limited thereto.

The organic silane may be selected from diethylsilane ($Et_2SiH_2$) and tetraethyl orthosilicate ($Si(OCH_2CH_3)_4$, TEOS), but is not limited thereto.

The organic aminosilane may include diisopropylaminosilane ($H_3Si(N(i\text{-}Prop)_2)$), bis(tertiary-butylamino)silane (($C_4H_9(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), tris(dimethylhydrazino)silane ($HSi(N(H)NMe_2)_3$), bis(diethylamino)silane ($H_2Si(NEt_2)_2$), bis(diisopropylamino)silane ($H_2Si(N(i\text{-}Prop)_2)_2$), tris(diisopropylamino)silane ($HSi(N(i\text{-}Prop)_2)_3$), or (diisopropylamino)silane ($H_3Si(N(i\text{-}Prop)_2)$), but is not limited thereto. As used herein, the abbreviation "Me" refers to a methyl group, the abbreviation "Et" refers to an ethyl group, and the abbreviation "i-Prop" refers to an isopropyl group.

In other example embodiments, the first precursor P1 and the second precursor P2 may be different precursors selected from all silicon precursors described above. Here, a size of the first precursor P1 may be greater than a size of the second precursor P2. In example embodiments, the size of the first precursor P1 may be greater than the size of the second precursor P2, and a molecular weight of the first precursor P1 may be greater than a molecular weight of the second precursor P2.

During the supplying of the first precursor P1 onto the lower structure 110 in process P12 of FIG. 1 and/or during the supplying of the second precursor P2 onto the lower structure 110 in process P14 of FIG. 1, the inside of the reaction space may be maintained at a temperature of about 100° C. to about 600° C. The first precursor P1 may be supplied in a vaporized state onto the lower structure 110. The second precursor P2 may be supplied after the supplying and adsorption of the first precursor P1 is complete, and may also be supplied in a vaporized state onto the lower structure 110. After the first precursor P1 and the second precursor P2 are supplied on the lower structure 110, the first chemisorbed layer AL1 of the first precursor P1, the second chemisorbed layer AL2 of the second precursor P2, and a physisorbed layer of each of the first precursor P1 and the second precursor P2 may remain on an inner wall of the trench TR and a top surface of the lower structure 110.

In process P16 of FIG. 1, a purge gas is supplied into the reaction space to remove unnecessary materials from the lower structure 110. In this case, the physisorbed layer of each of the first precursor P1 and the second precursor P2 that remain on the lower structure 110 may also be removed due to the purge gas. For example, an inert gas, such as argon (Ar), helium (He), and neon (Ne), or nitrogen ($N_2$) gas, may be used as the purge gas. During the supplying of the purge gas into the reaction space, the inside of the reaction space may be maintained at a temperature of about 100° C. to about 600° C.

In process P18 of FIG. 1, a reactive gas is supplied onto the resultant structure of FIG. 2B in which the first chemisorbed layer AL1 and the second chemisorbed layer AL2 are formed. Thus, the first ligand of the first precursor P1 and the second ligand of the second precursor P2 may be removed from the lower structure 110, and an atomic-level material film including the first central element and the second central element may be formed.

The reactive gas may include, for example, an oxidizing gas or a reducing gas.

In example embodiments, the oxidizing gas may include $O_2$, $O_3$, $H_2O$, NO, $NO_2$, $N_2O$, $CO_2$, $H_2O_2$, HCOOH, $CH_3COOH$, $(CH_3CO)_2O$, plasma $O_2$, remote plasma $O_2$, plasma $N_2O$, plasma $H_2O$, or a combination thereof, but is not limited thereto.

In example embodiments, the reducing gas may include $H_2$, $NH_3$, $GeH_4$, hydrazine ($N_2H_4$), hydrazine derivative, or a combination thereof, but is not limited thereto. The hydrazine derivative may include C1 to C10 alkylhydrazine, dialkylhydrazine, or a combination thereof, but is not limited thereto.

In other example embodiments, the reactive gas may include a nitrogen-containing gas. The nitrogen-containing gas may include organic amine compounds, such as monoalkylamine, dialkylamine, trialkylamine, and alkylenediamine, hydrazine, ammonia, or a combination thereof.

In example embodiments, when the reactive gas is supplied onto the lower structure 110 according to process P18 of FIG. 1, the supplying of the oxidizing gas as the reactive gas may include sequentially supplying a plurality of oxidizing gases having different oxidizing power. In example embodiments, the plurality of oxidizing gases may include different oxidizing gases selected from the oxidizing gases exemplarily described above. The sequential supplying of the plurality of oxidizing gases may include performing an additional purge process after a first oxidizing gas having a first oxidizing power is supplied onto the lower structure 110 and before a second oxidizing gas having a second oxidizing power is suppled onto the lower structure 110.

In process P20 of FIG. 1, in a similar manner to that described with reference to process P16 of FIG. 1, a purge gas may be supplied into the reaction space, and thus, unnecessary by-products may be removed from the atomic-level material film. During the supplying of the purge gas into the reaction space, the inside of the reaction space may be maintained at a temperature of about 100° C. to about 600° C.

In process P22 of FIG. 1, it may be determined whether a material film has been formed to a desired target thickness on the lower structure 110, and a deposition cycle including processes P12 to P20 of FIG. 1 may be repeated until the desired target thickness is obtained.

Figure 2C:
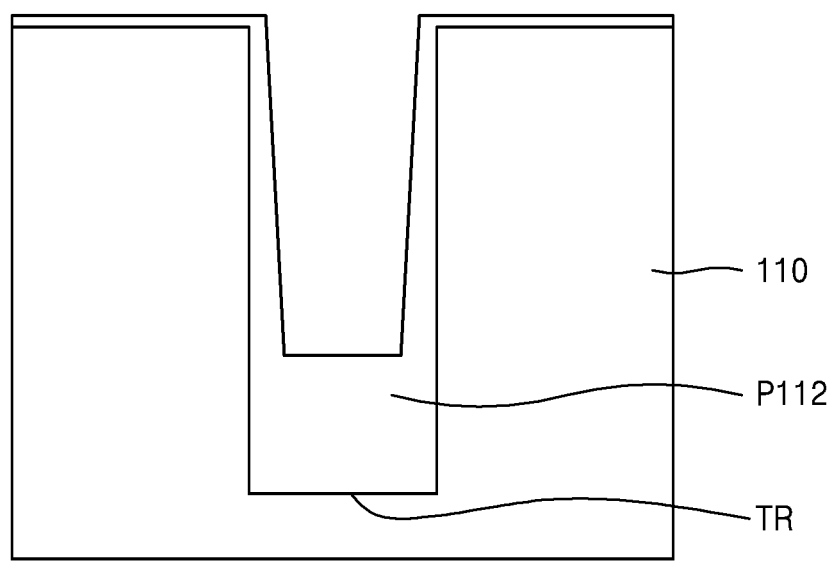

Referring to FIG. 2C, an ALD cycle including processes P12 to P20 of FIG. 1 may be repeated plural times, and thus, a preliminary material film P112 may be obtained on the lower structure 110.

While the ALD cycle including processes P12 to P20 of FIG. 1 is being repeated plural times, atomic-level material films may be deposited in a relatively deep portion of the trench TR more preferentially than at the entrance side of the trench TR due to a steric hindrance effect provided by the first precursor P1, and thus, a deposition rate of the atomic-level material films may be higher on the bottom surface of the trench TR than on the entrance side of the trench TR. As a result, a bottom-up filling method may be performed, and thus, the preliminary material film P112 may be formed to a greater thickness on the bottom surface of the trench TR than on the top surface of the lower structure 110.

Figure 2D:
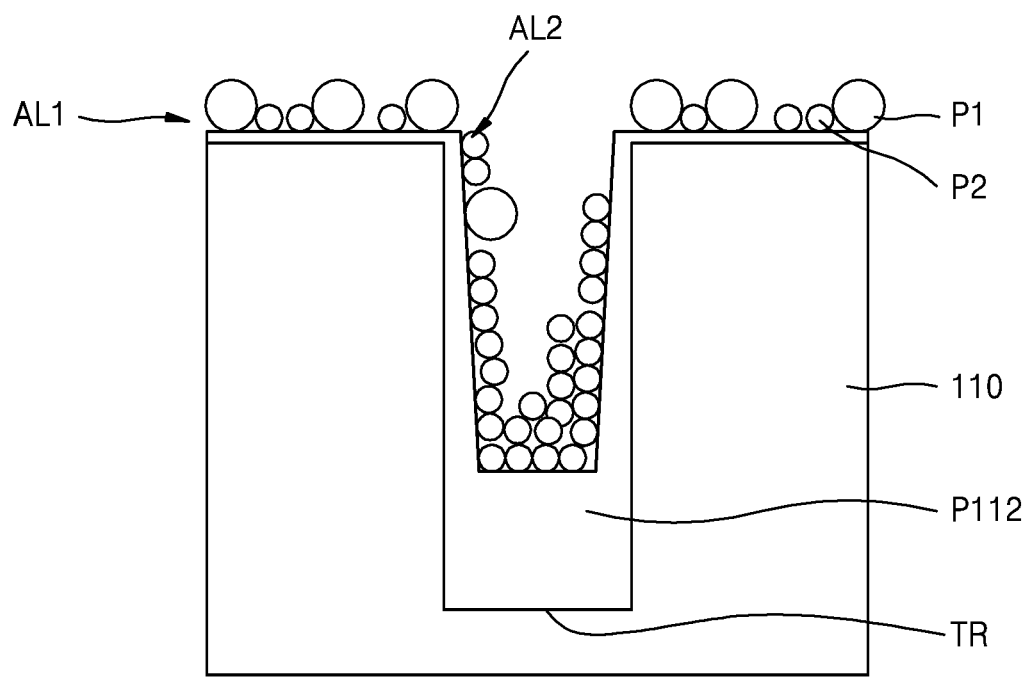

Referring to FIG. 2D, processes P12 and P14 may be sequentially performed on the resultant structure of FIG. 2C in a similar manner to that described with reference to FIGS. 2A and 2B, and thus, a first chemisorbed layer AL1 and a second chemisorbed layer AL2 may be formed on the preliminary material film P112.

Figure 2E:
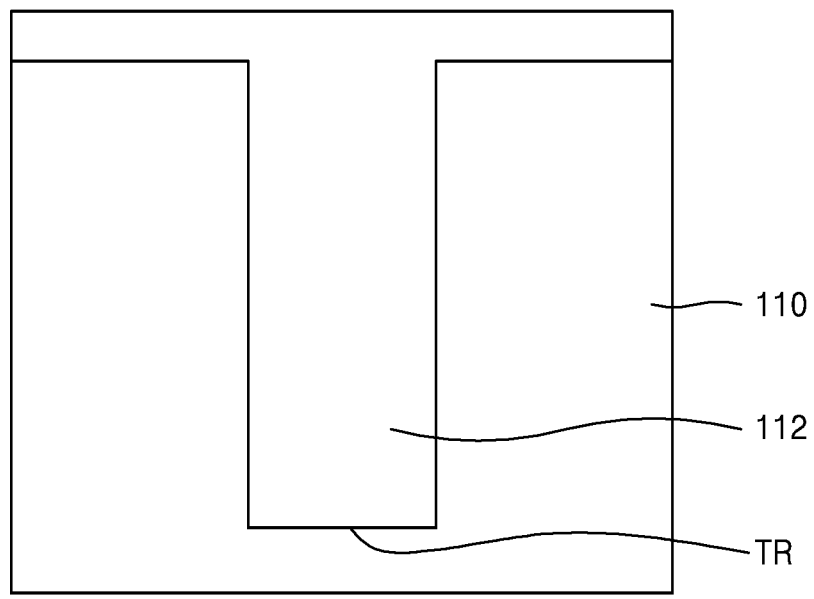

Referring to FIG. 2E, a process of performing processes P16 to P20 of FIG. 1 on the resultant structure of FIG. 2D and a process of determining whether the material film has been formed to the desired target thickness on the lower structure 110 according to process P22 may be repeated until a material film 112 having the desired target thickness is obtained. When it is determined in process P22 that the material film 112 having the target thickness is obtained in process P22, the ALD process described with reference to FIG. 1 is ended.

When the material film 112 is formed according to the method shown in FIGS. 1 and 2A to 2E, the number of times the ALD cycle is performed may be adjusted to control a thickness of the material film 112. In addition, when the material film 112 is formed according to the method shown in FIGS. 1 and 2E, energy (e.g., plasma, light, and a voltage) may be applied. A point in time at which the energy is applied may be variously selected. For example, energy (e.g., plasma, light, and a voltage) may be applied at a point in time when the first precursor P1 is introduced into the reaction space in process P12 of FIG. 1, at a point in time when the second precursor P2 is introduced into the reaction space in process P14, at a point in time when a reactive gas is introduced into the reaction space in process P18, or between the respective points in time. Also, when the first precursor P1 is introduced into the reaction space in process P12 of FIG. 1 and when the second precursor P2 is introduced into the reaction space in process P14 of FIG. 1, various kinds of material films may be formed by appropriately selecting another precursor, which is supplied together with the first precursor P1 or the second precursor P2, a reactive gas, and reaction conditions.

In example embodiments, the other precursor that may be supplied together with the first precursor P1 or the second precursor P2 may include silicon (Si), carbon (C), or a metal. The other precursor may include at least one ligand selected from hydride, hydroxide, halide, azide, alkyl, alkenyl, cycloalkyl, allyl, alkynyl, amino, dialkylaminoalkyl, monoalkylamino, dialkylamino, diamino, di(silyl-alkyl)amino, di(alkyl-silyl)amino, disilylamino, alkoxy, alkoxyalkyl, hydrazide, phosphide, nitrile, dialkylaminoalkoxy, alkoxyalkyldialkylamino, siloxy, diketonate, cyclopentadienyl, silyl, pyrazolate, guanidinate, phosphoguanidinate, amidinate, phosphoamidinate, ketoiminate, diketoiminate, and carbonyl.

The material film that may be obtained using the method according to the embodiments described with reference to FIGS. 1 and 2A to 2E may include or may be a silicon oxide film, a silicon nitride film, a silicon oxynitride film, a silicon oxycarbonitride film, a metal oxide film, or a metal nitride film, but is not limited thereto.

The material film manufactured using the method according to the embodiment may be used according to various purposes. For example, the material film may be used for a device isolation film and an insulating film of a semiconductor device, a dielectric film included in a capacitor, a gate dielectric film of a transistor, a conductive barrier film used for an interconnection, a resistive film, a magnetic film, a barrier metal film for liquid crystals, a member for thin-film solar cells, a member for semiconductor equipment, or a nanostructure, but is not limited to the above-described examples.

In the method of forming the material film according to the embodiments, which is described with reference to FIGS. 1 and 2A to 2E, after the material film 112 having the target thickness is obtained, a process of annealing the material film 112 may be performed. The annealing of the material film 112 may be performed at a temperature higher than a process temperature that is applied to processes P12 to P20. For example, the annealing process may be performed at a temperature selected in the range of about 500° C. to about 1150° C. For example, in one embodiment, a process temperature having a value from 100° C. to 600° C. is used in the processes P12 to P20, and a temperature having a value from 500° C. to 1150° C., which is higher than the process temperature, is used for annealing. In example embodiments, the annealing process may be performed in a nitrogen atmosphere. By performing the annealing process described above, the material film 112 may be densified and impurities may be removed from the material film 112, and thus, film characteristics of the material film 112 may be improved. For example, when a silicon oxide film is formed using the method according to the embodiments described with reference to FIGS. 1 and 2A to 2E, the silicon oxide film may be densified due to the annealing process, and thus, a density of the silicon oxide film may be increased.

According to the method of forming the material film 112, which is described with reference to FIGS. 1 and 2A to 2E, after the first chemisorbed layer AL1 of the first precursor P1 including the first ligand having a relatively large size is formed on the lower structure 110, the second chemisorbed layer AL2 of the second precursor P2 including the second ligand having a relatively small size may be formed in a vacant space exposed by the first chemisorbed layer AL1, and the reactive gas may be supplied to the first chemisorbed layer AL1 and the second chemisorbed layer AL2 to form the atomic-level material film. Thus, a deposition rate of the material film may be relatively low on the top surface of the lower structure 110 and the entrance side of the trench TR (e.g., at a height above a particular threshold height) and relatively high on the deep region of the trench TR (e.g., at a height below the particular threshold height). The threshold height may be, for example, a certain amount of the overall height of the trench TR (e.g., ¼ of the height, ⅓ of the height, or ½ of the height). Accordingly, the inside of the trench TR may be filled with a high purity of the material film 112 having no seams or voids. Furthermore, according to the method of forming the material film 112, which is described with reference to FIGS. 1 and 2A to 2E, it may not be necessary to perform a separate etching process or use a separate inhibitor for each ALD cycle to reduce a deposition rate at which the material film 112 is formed on the top surface of the lower structure 110 and the entrance side of the trench TR. Thus, it may be possible to fundamentally prevent problems, such as the likelihood of contamination due to etching by-products, which may be generated during the etching process, or the adverse influence of residual components of the inhibitor upon electrical characteristics. Therefore, the trench TR, which is deep and narrow, may be formed in the lower structure 110 and filled with the material film 112 having no seams or voids by using a relatively simple process. Also, because the material film 112 filling the trench TR has a high purity, an IC device adopting the material film 112 may exhibit excellent electrical characteristics.

Figure 3:
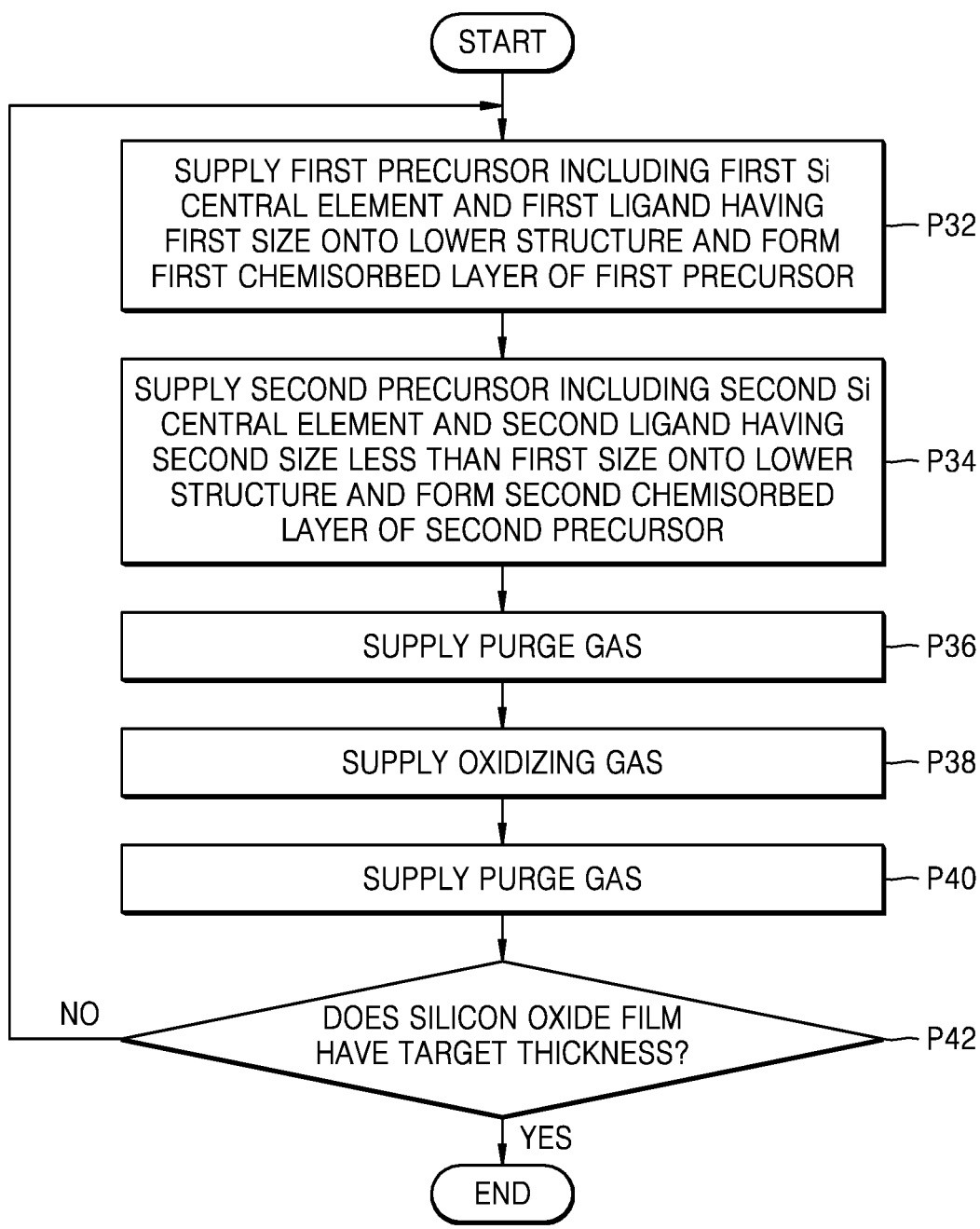
FIG. 3 is a flowchart of a method of forming a material film, according to an embodiment.

FIG. 3 is a flowchart of a method of forming a material film, according to an embodiment. A method of forming a silicon oxide film using an ALD process will be described with reference to FIG. 3. The method of forming the material film, according to the present embodiment, may be substantially the same as the method of forming the material film, which is described with reference to FIGS. 1 and 2A to 2E. In the present embodiment, each of a central element of a first precursor P1 and a central element of a second precursor P2 includes a silicon atom.

Referring to FIGS. 3 and 2A, in process P32, the first precursor P1 having a Si central element and a first ligand is supplied onto a lower structure 110 in a reaction space to form a first chemisorbed layer AL1 of the first precursor P1 on the lower structure 110.

Referring to FIGS. 3 and 2B, in process P34, the second precursor P2 including a Si central element and a second ligand is supplied onto the lower structure 110 to form a second chemisorbed layer AL2 of the second precursor P2.

Detailed descriptions of the first ligand of the first precursor P1 and the second ligand of the second precursor P2 may be the same as described with reference to processes P12 and P14 of FIG. 1.

In process P36 of FIG. 3, in the same manner as that described with reference to process P16 of FIG. 1, a purge gas is supplied into the reaction space to remove unnecessary materials from the lower structure 110.

In process P38 of FIG. 3, in a similar manner to that described with reference to process P18 of FIG. 1, an oxidizing gas is supplied onto the resultant structure of FIG. 2B in which the first chemisorbed layer AL1 and the second chemisorbed layer AL2 are formed. Thus, the first ligand of the first precursor P1 and the second ligand of the second precursor P2 may be removed from the lower structure 110, and an atomic-level silicon oxide film including a Si central element is formed.

In process P40 of FIG. 3, in a similar manner to that described with reference to process P20 of FIG. 1, a purge gas is supplied into the reaction space, and thus, unnecessary by-products may be removed from the atomic-level silicon oxide film including the Si central element.

In process P42 of FIG. 3, it is determined whether the silicon oxide film has been formed to a target thickness on the lower structure 110, and an ALD cycle including processes P32 to P40 of FIG. 3 may be repeated until the silicon oxide film obtains the target thickness. The use of silicon, as described in FIG. 3, may also occur in the later-described embodiments, for example, of FIGS. 4 and 5, or later figures.

Figure 4:
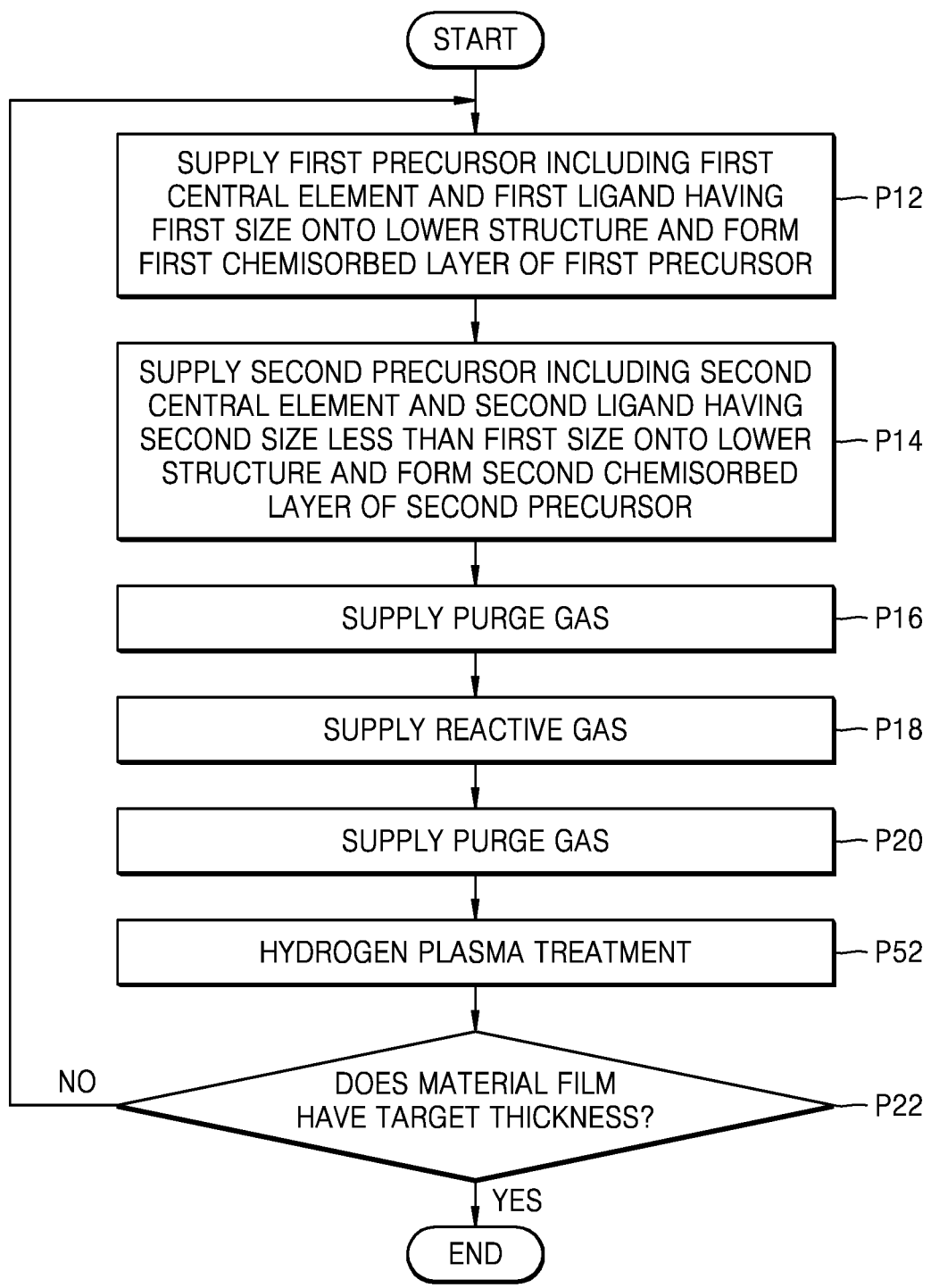
FIG. 4 is a flowchart of a method of forming a material film, according to embodiments.

FIG. 4 is a flowchart of a method of forming a material film, according to embodiments.

The method of forming the material film, which is shown in FIG. 4, may be substantially the same as the method of forming the material film, which is described with reference to FIGS. 1 and 2A to 2E. However, in the method of forming the material film, which is shown in FIG. 4, after unnecessary by-products are removed from an atomic-level material film by supplying a purge gas according to process P20, the resultant structure including the atomic-level material film is treated using hydrogen plasma in process P52.

Due to the hydrogen plasma treatment, unnecessary impurities that may remain in the atomic-level material film may be removed from the atomic-level material film. For example, because a first precursor P1 includes a first ligand having a relatively large size, impurities derived from the first ligand may remain in the atomic-level material film and be effectively removed due to the hydrogen plasma treatment. Accordingly, the purity of the material film may be further increased by forming the material film using the method shown in FIG. 4. Though the hydrogen plasma treatment of process P52 is shown in FIG. 4 (and FIG. 5 below) to occur before the step of determining whether the material film has a target thickness (process P52), in some embodiments, this step may be performed after process P22, so that it occurs only once between the start and end of the overall process.

Figure 5:
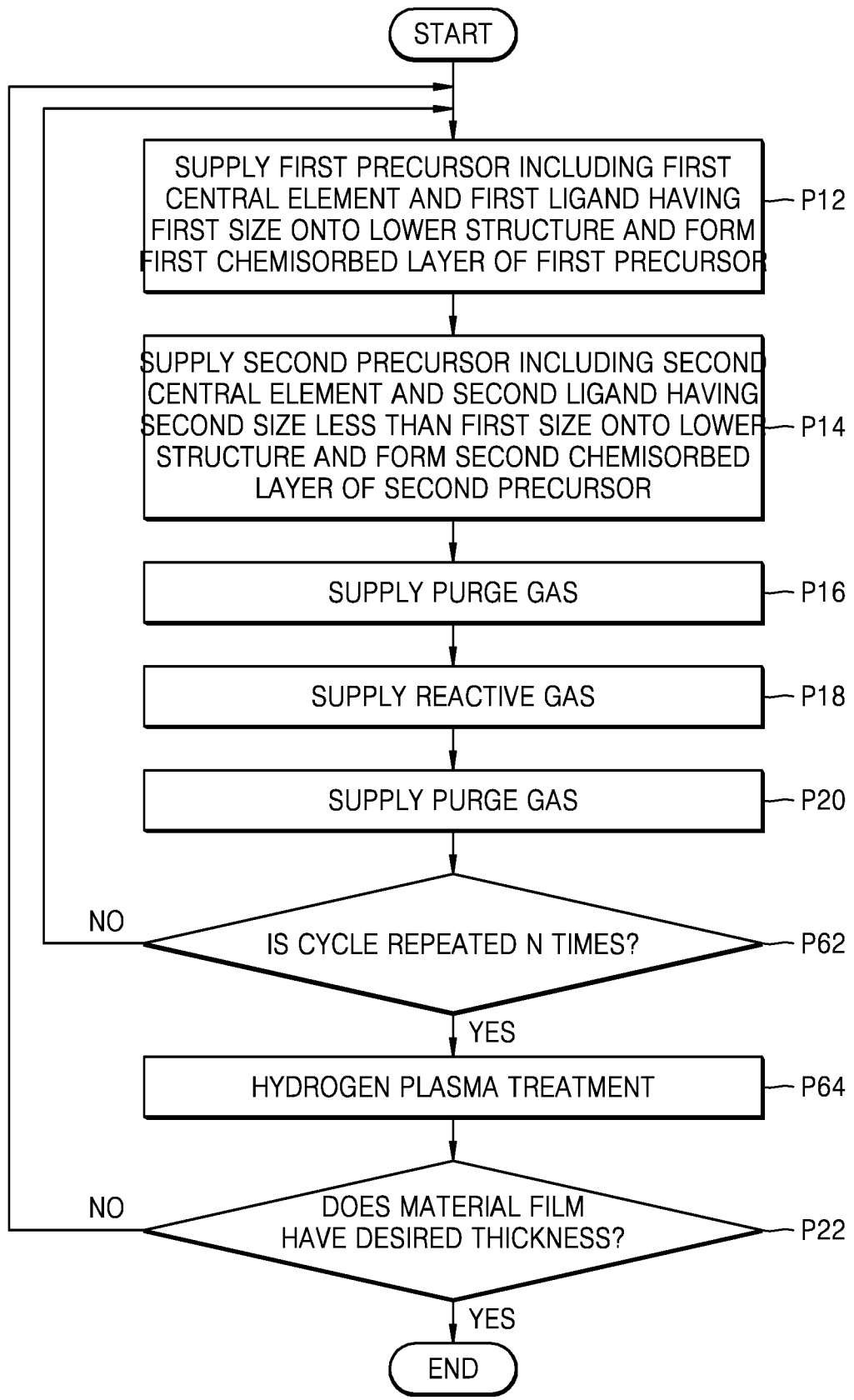
FIG. 5 is a flowchart of a method of forming a material film, according to embodiments.

FIG. 5 is a flowchart of a method of forming a material film, according to embodiments.

The method of forming the material film, which is shown in FIG. 5, may be substantially the same as the method of forming the material film, which is described with reference to FIGS. 1 and 2A to 2E. However, in the method of forming the material film, which is shown in FIG. 5, the resultant structure obtained after an ALD cycle including processes P12 to P20 is performed plural times may be treated using hydrogen plasma in process P64. Detailed descriptions of processes P12 to P20 may be understood with reference to FIGS. 1 and 2A to 2E.

In process P62 of FIG. 5, the number of times the ALD cycle including processes P12 to P20 is repeated may be confirmed. When the number of times the ALD cycle is repeated reaches a predetermined set value N (here, N is an integer more than or equal to 2), the hydrogen plasma treatment may be performed according to process P64. In example embodiments, the predetermined set value N may be selected within a range of 2 to 10. Unnecessary impurities that may remain in a plurality of atomic-level material films may be removed due to the hydrogen plasma treatment.

In process P22 of FIG. 5, it is determined whether a desired material film has been formed to a target thickness on a lower structure 110, and processes P12 to P20, P62, and P64 may be repeated until the material film obtains the target thickness.

In the method of forming the material film according to the embodiments described with reference to FIGS. 1 to 5, the inside of the trench (refer to TR in FIG. 2E) may be filled with a high purity of the material film 112 having no seams or voids. Also, the formation of the material film 112 may not involve an additional etching process for each cycle of an ALD process or use an additional inhibitor to reduce a deposition rate at a top surface of the lower structure 110 and an entrance side of the trench TR. Thus, it may be possible to fundamentally prevent problems, such as the likelihood of contamination due to the etching process or the use of the inhibitor or the adverse influence of the etching process or the inhibitor upon electrical characteristics. Accordingly, in the method of forming the material film according to the embodiments described with reference to FIGS. 1 to 5, the trench TR, which is deep and narrow, may be formed in the lower structure 110 and easily filled with the material film 112 having no seams or voids using a relatively simple process. Also, because the trench TR is filled with the material film 112 having a high purity, an IC device adopting the material film 112 may exhibit excellent electrical characteristics.

Figure 6:
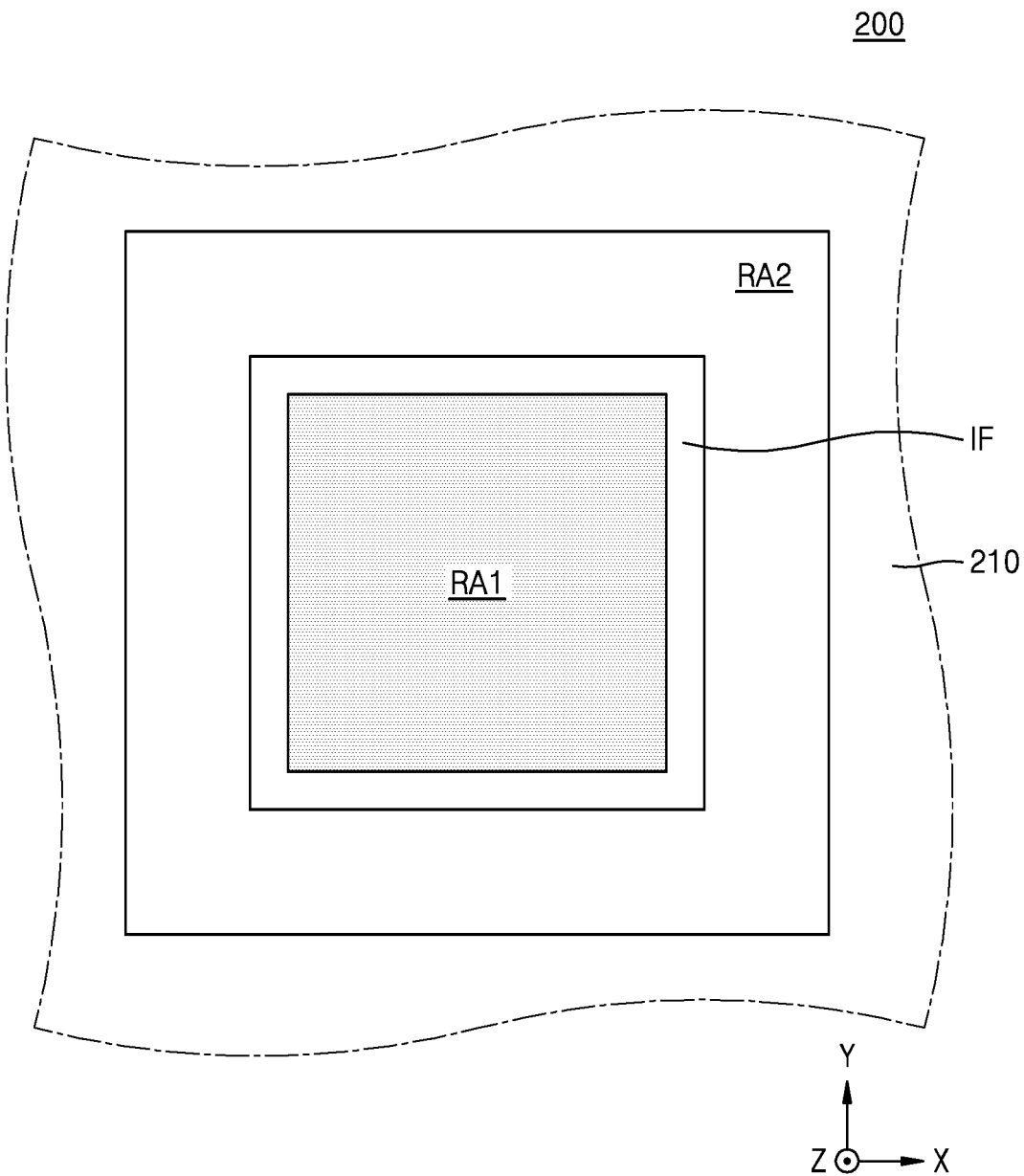
FIG. 6 is a plan view of a schematic configuration of an integrated circuit (IC) device according to embodiments.

FIG. 6 is a plan view of a schematic configuration of an integrated circuit (IC) device 200 according to embodiments.

Referring to FIG. 6, the IC device 200 may include a substrate 210 including a first region RA1, a second region RA2 surrounding the first region RA1, and an interface region IF between the first region RA1 and the second region RA2.

The substrate 210 may include, or may be formed of, for example a semiconductor element (e.g., silicon (Si) and germanium (Ge)) or at least one compound semiconductor selected from silicon germanium (SiGe), silicon carbide (SiC), gallium arsenide (GaAs), indium arsenide (InAs), and indium phosphide (InP). The substrate 210 may include a conductive region, for example, a doped well or a doped structure.

The first region RA1 may include a memory cell region of the IC device 200. In example embodiments, the first region RA1 may be a memory cell region of dynamic random access memory (DRAM). The first region RA1 may include a unit memory cell having a transistor and a capacitor or a unit memory cell having a switching element and a variable resistor.

The second region RA2 may be a core region or a peripheral circuit region (hereinafter, inclusively referred to as the "peripheral circuit region"). Peripheral circuits required to drive memory cells located in the first region RA1 may be arranged in the second region RA2. In example embodiments, the second region RA2 may include a row decoder, a sense amplifier, a column decoder, a self-refresh control circuit, a command decoder, a mode register set/extended mode register set (MRS/EMRS) circuit, an address buffer, a data input/output (I/O) circuit, a clock circuit configured to generate a clock signal, and a power supply circuit configured to receive an externally applied power supply voltage and generate or divide an internal voltage.

A plurality of conductive lines and insulating structures may be arranged in the interface region IF. The plurality of conductive lines may be installed to enable electrical connection between the first region RA1 and the second region RA2, and the insulating structures may be provided to enable insulation between the first region RA1 and the second region RA2.

Figure 7:
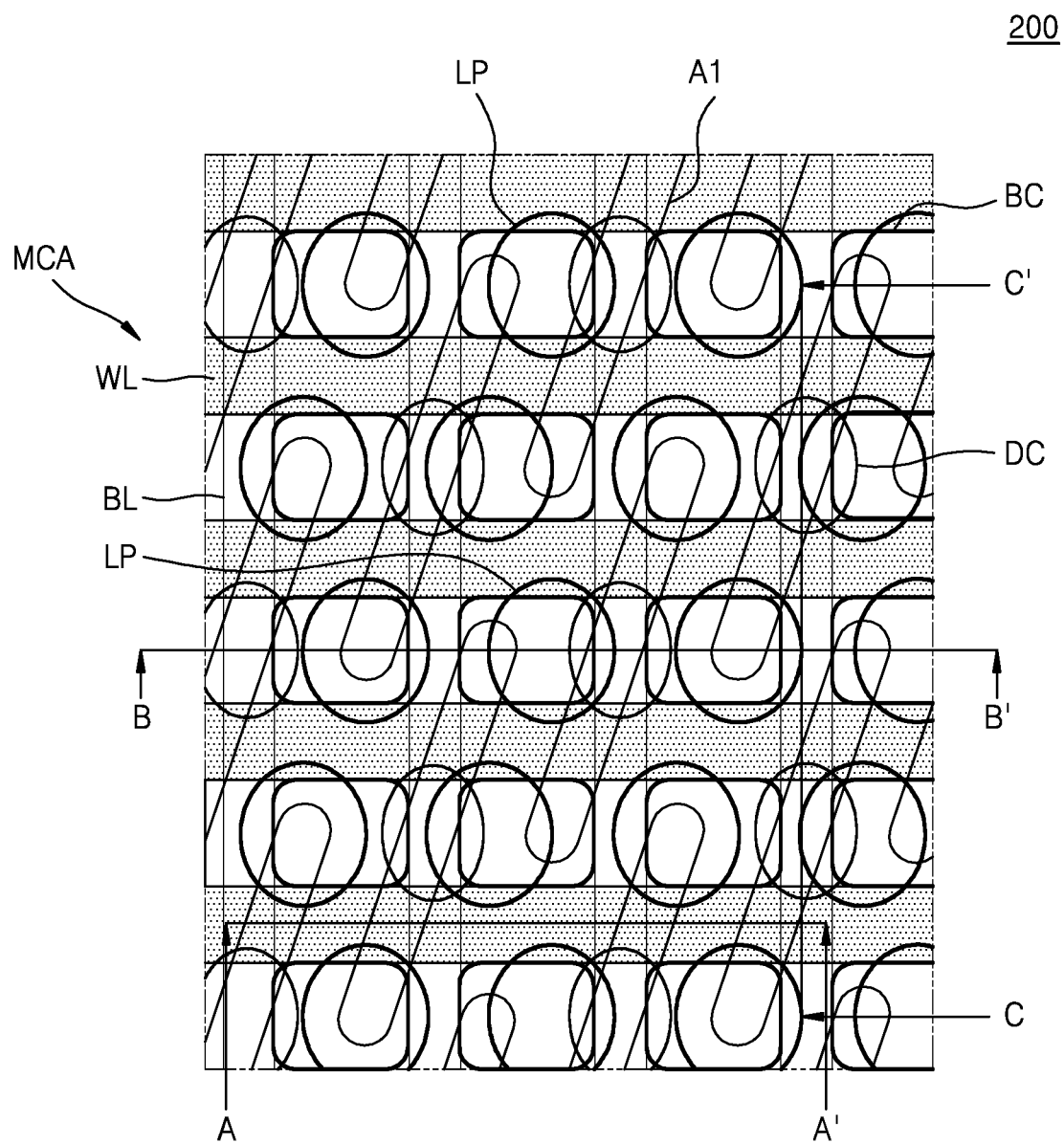
FIG. 7 is a schematic plan layout of main components of a memory cell array region according to embodiments.

FIG. 7 is a schematic plan layout of main components of a memory cell array region MCA of the IC device 200, according to embodiments. The memory cell array region MCA shown in FIG. 7 may be included in the first region RA1 shown in FIG. 6.

Referring to FIG. 7, the memory cell array region MCA may include a plurality of active regions A1. Each of the plurality of active regions A1 may be arranged to have a major axis in a diagonal direction (Q direction) with respect to a first direction (X direction) and a second direction (Y direction). Some of the plurality of active regions A1 may be arranged in a line in the first direction (X direction). Some others of the plurality of active regions A1 may be arranged in a line in the second direction (Y direction) intersecting with the first direction (X direction).

A plurality of word lines WL may intersect with the plurality of active region A1 and extend parallel to each other in the first direction (X direction). A plurality of bit lines BL may extend parallel to each other in the second direction (Y direction) on the plurality of word lines WL. The plurality of bit lines BL may be connected to the plurality of active regions A1 through direct contacts DC (e.g., vertical contacts, or pillars extending in the vertical direction, Z direction, that contact a respective bit line BL and active region A1). It should be noted that the term "contact" as used in verb form in this specification refers to a direct connection, i.e., touching.

A plurality of buried contacts BC may be formed between two adjacent bit lines BL of the plurality of bit lines BL. The plurality of buried contacts BC may be arranged in a line in each of the first direction (X direction) and the second direction (Y direction). A plurality of landing pads LP may be formed on the plurality of buried contacts BC. The plurality of buried contacts BC and the plurality of landing pads LP may connect a lower electrode (not shown) of a capacitor, which is formed on the plurality of bit lines BL, to the active region A1. Each of the plurality of landing pads LP may partially overlap the buried contact BC.

FIGS. 8A to 8C and 9A and 9B are cross-sectional views of main components of the IC device 200 according to embodiments.

Figure 8A:
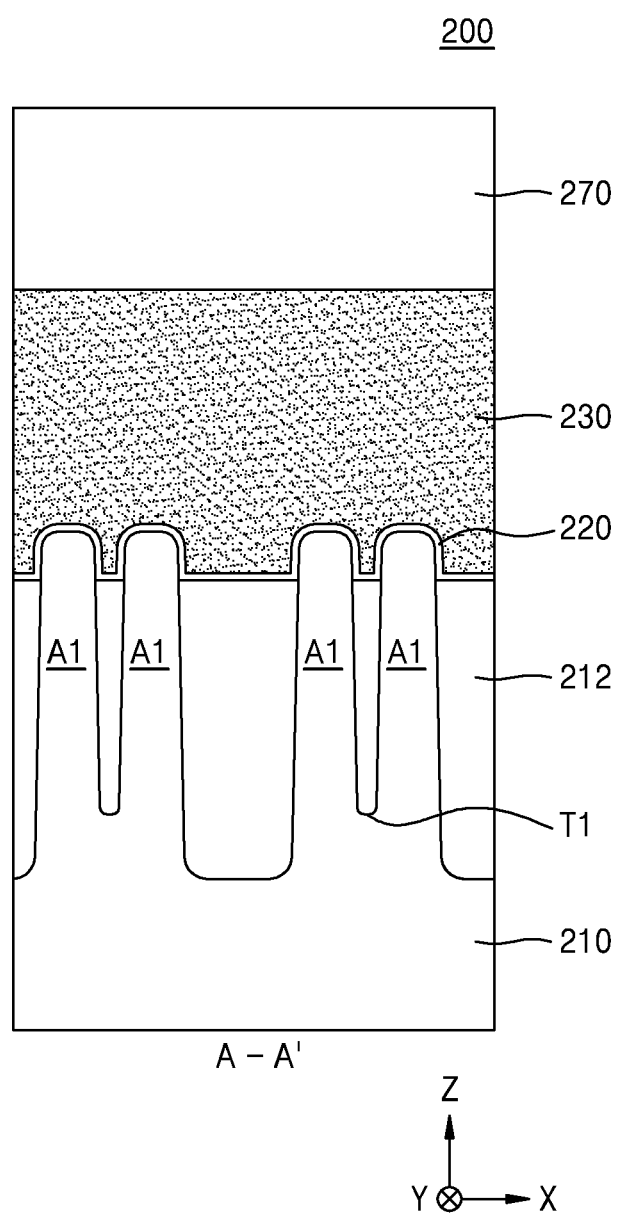
FIGS. 8A to 8C are cross-sectional views of main components of an IC device according to embodiments.
Figure 8B:
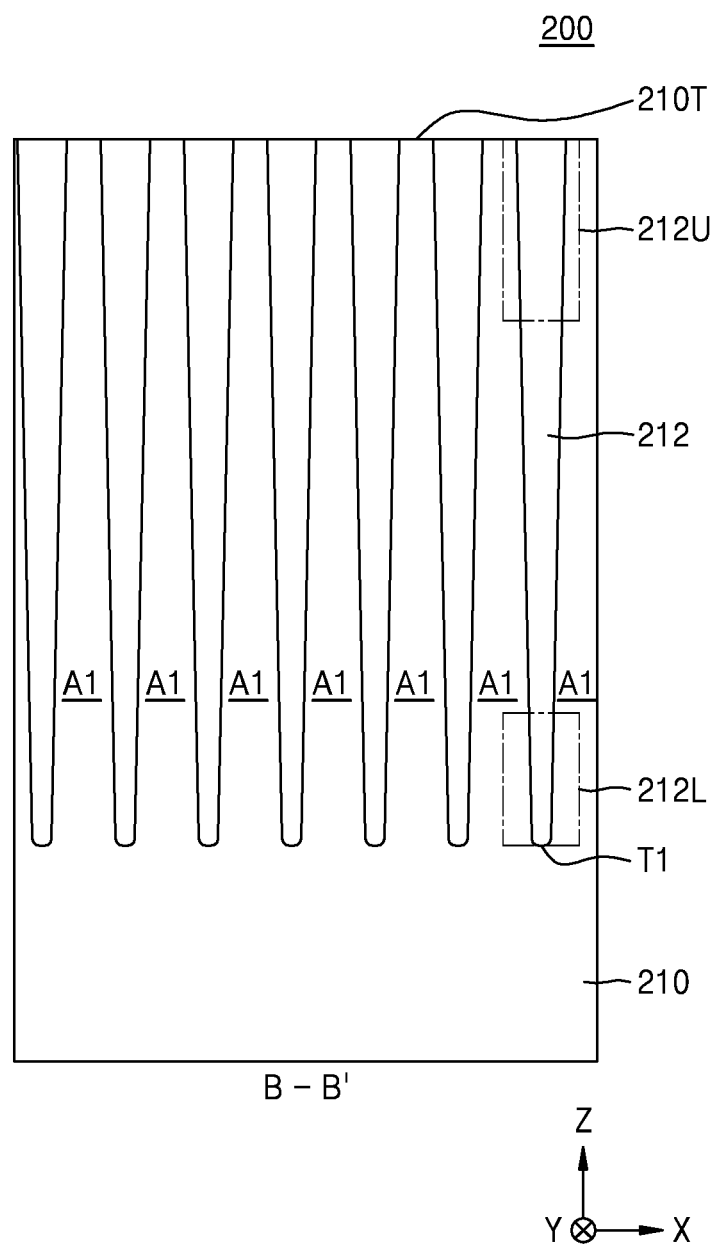
Figure 8C:
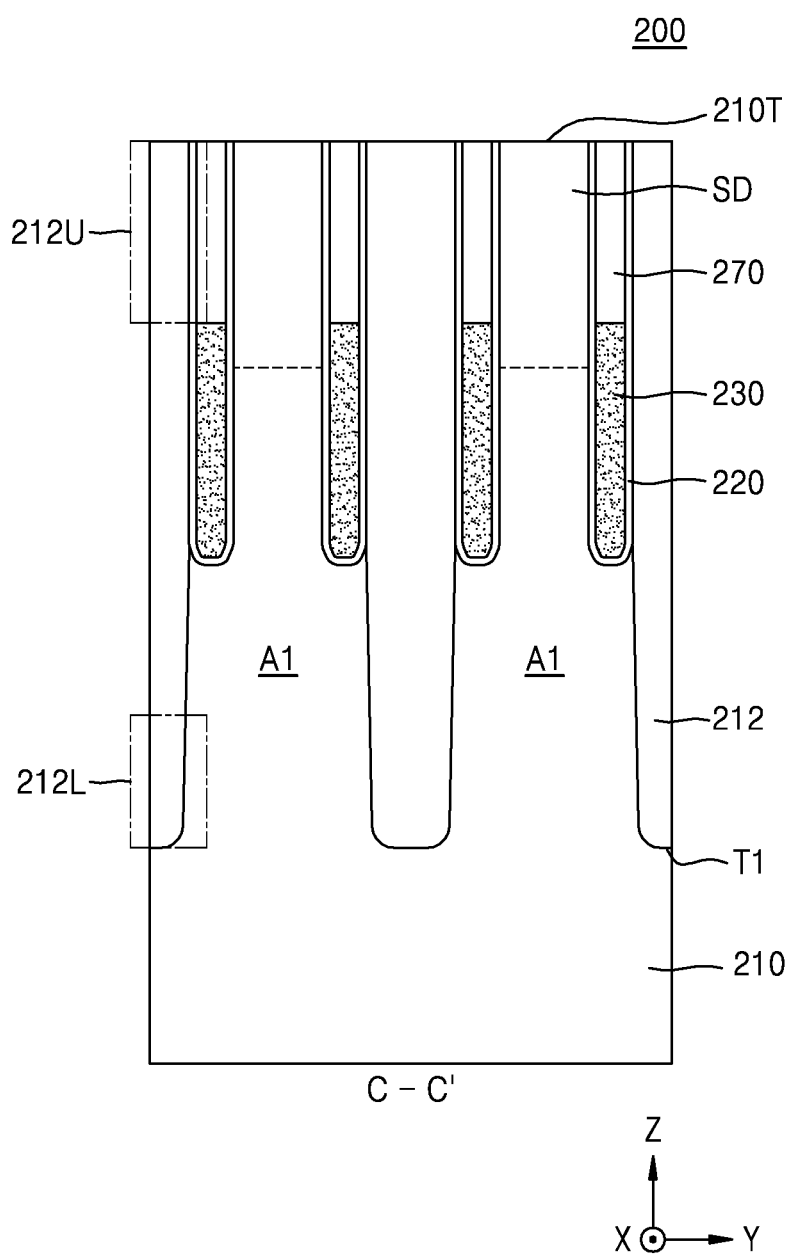
Figure 9A:
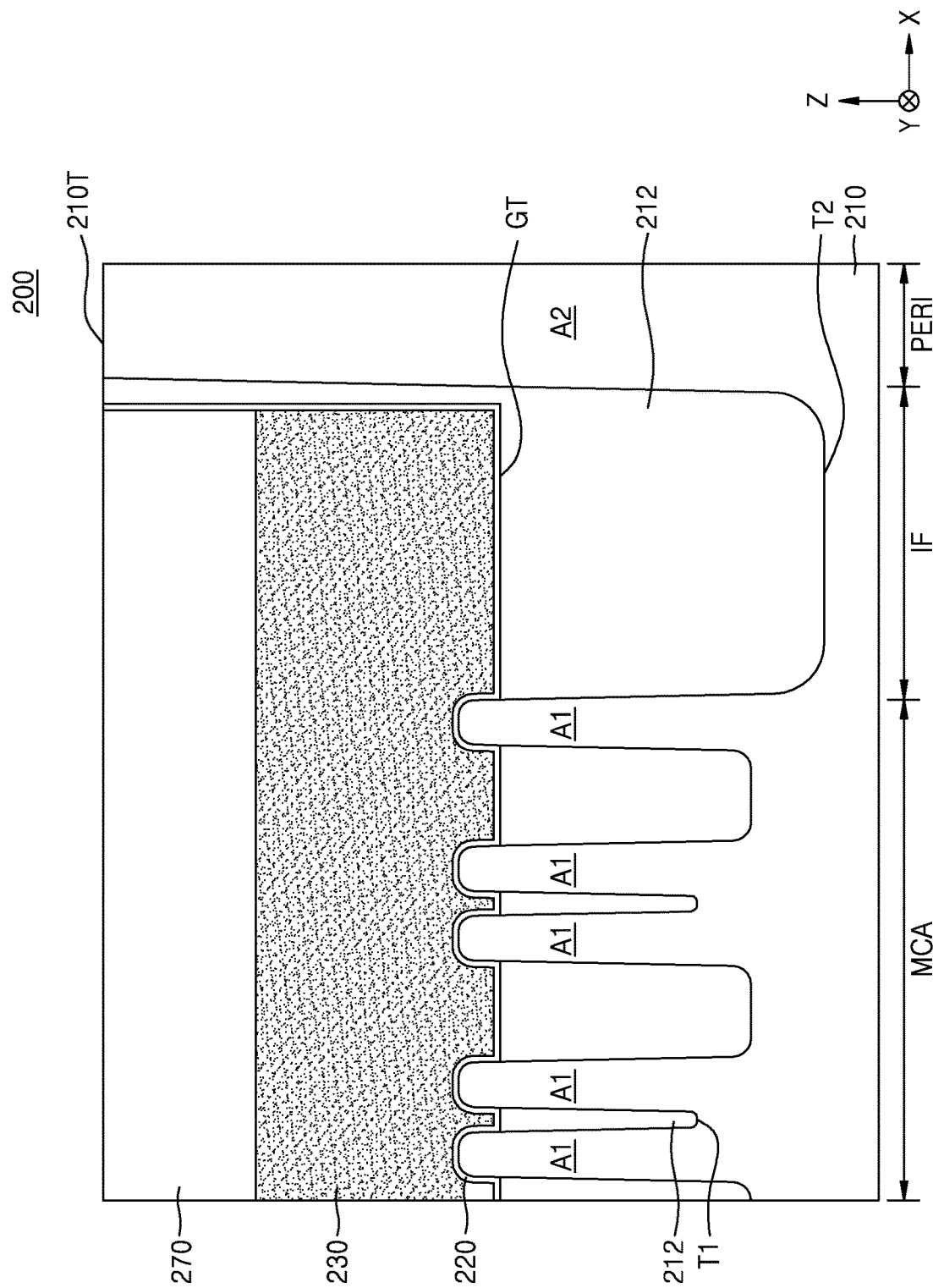
FIGS. 9A and 9B are cross-sectional views of main components of an IC device according to embodiments.
Figure 9B:
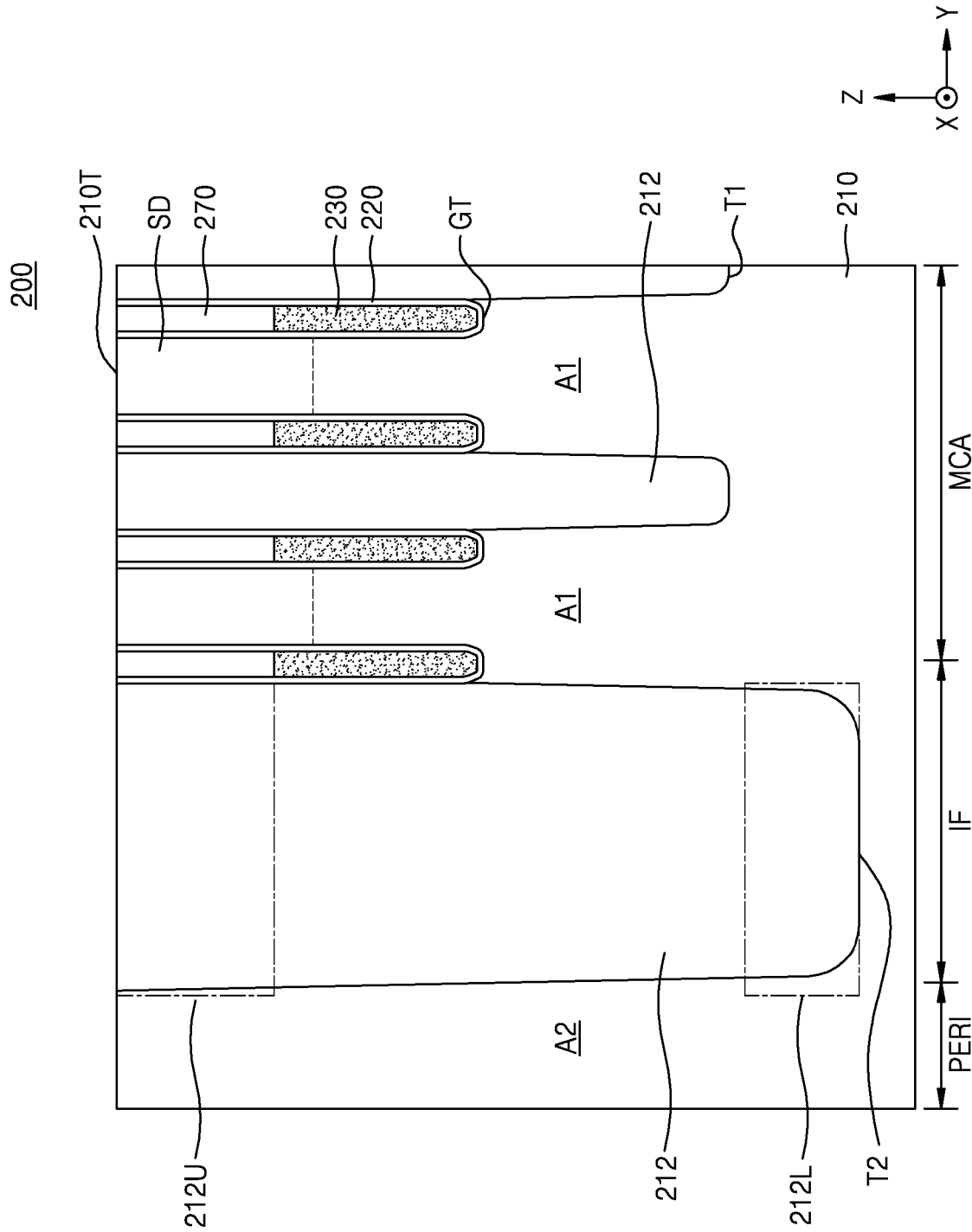

More specifically, FIG. 8A is a cross-sectional view of some components, which is taken along a line A-A' of FIG. 7. FIG. 8B is a cross-sectional view of some components, which is taken along a line B-B' of FIG. 7. FIG. 8C is a cross-sectional view of some components, which is taken along a line C-C' of FIG. 7. FIGS. 9A and 9B are cross-sectional views of respective partial regions of the memory cell array region MCA, an interface region IF, and a peripheral circuit region PERI of the IC device 200. In FIGS. 9A and 9B, the memory cell array region MCA and the peripheral circuit region PERI may respectively correspond to the first region RA1 and the second region RA2 shown in FIG. 6, and the interface region IF may be a region between the memory cell array region MCA and the peripheral circuit region PERI. FIG. 9A illustrates some components in a partial region taken along the line A-A' of FIG. 7 and the interface region IF and the peripheral circuit region PERI, which are adjacent to the partial region. FIG. 9B illustrates some components in a partial region taken along the line C-C' of FIG. 7 and the interface region IF and the peripheral circuit region PERI, which are adjacent to the partial region.

Referring to FIGS. 8A to 8C and 9A and 9B, in the IC device 200, a device isolation trench T1 may be formed in the memory cell array region MCA of a substrate 210, and an interface trench T2 may be formed in the interface region IF of the substrate 210. A device isolation film 212 may be formed on the substrate 210 to fill the device isolation trench T1 and the interface trench T2. A plurality of active regions A1 may be defined in the memory cell array region MCA by the device isolation film 212 filling the device isolation trench T1 in the memory cell array region MCA, while an active region A2 may be defined in the peripheral circuit region PERI by the device isolation film 212 filling the interface trench T2 in the interface region IF.

The device isolation film 212 may include a silicon oxide film. In example embodiments, the device isolation film 212 may include a silicon oxide film, which may be formed using the methods of forming the material films, which are described with reference to FIGS. 1 to 5, or methods that are variously modified and changed within the scope of the inventive concept.

The device isolation film 212 may not include impurities that adversely affect electrical characteristics. For example, the device isolation film 212 may include a silicon oxide film having an allowable carbon atom content of less than about 3 atomic percent (at %) (e.g., from or between 0% to just under 3%). Carbon atoms included at an allowable content in the device isolation film 212 may be derived from the first ligand of the first precursor P1 used in process P12 of FIG. 1 and the second ligand of the second precursor P2 used in process P14 of FIG. 1.

In particular, the first ligand of the first precursor P1 may contain a greater number of carbon atoms than the second ligand of the second precursor P2. As described with reference to FIG. 2B, during the formation of the device isolation film 212, a first chemisorbed layer AL1 of the first precursor P1 may be mainly formed on an entrance side of each of the device isolation trench T1 and the interface trench T2, and a second chemisorbed layer AL2 of the second precursor P2 may be mainly formed near a deep region or a bottom surface of each of the device isolation trench T1 and the interface trench T2. Accordingly, a carbon content of an upper portion 212U of the device isolation film 212 that fills the device isolation trench T1 and the interface trench T2 may be higher than a carbon content of a lower portion 212L thereof within an allowable range. The upper portion 212U of the device isolation film 212 may be a portion of the device isolation film 212, which is relatively close to an entrance of each of the device isolation trench T1 and the interface trench T2, that is, a portion of the device isolation film 212, which is relatively close to a top surface 210T of the substrate 210. The lower portion 212L of the device isolation film 212 may be a portion of the device isolation film 212, which is relatively close to the bottom surface of each of the device isolation trench T1 and the interface trench T2.

In example embodiments, the upper portion 212U of the device isolation film 212 may include carbon atoms at a first content that is selected in the range of more than 0 at % and less than about 3 at %. The lower portion 212L of the device isolation film 212 may include carbon atoms at a second content that is selected in the range of more than or equal to 0 at % and less than about 3 at %, and the second content may be lower than the first content. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

The memory cell array region MCA may include a plurality of gate trenches GT, which intersect with the plurality of active regions A1 and the device isolation film 212 and extend in a first direction (X direction). A gate dielectric film 220, a conductive line 230, and an insulating capping pattern 270 may be formed inside each of the plurality of gate trenches GT. The gate dielectric film 220 may cover an inner wall of the gate trench GT, the conductive line 230 may partially fill the gate trench GT on the gate dielectric film 220, and the insulating capping pattern 270 may cover the conductive line 230. The conductive line 230 may constitute the word line WL shown in FIG. 7.

At the bottom surface of the gate trench GT, a level (e.g., a vertical level measured from a bottom of the substrate 210) of a portion at which the active region A1 of the substrate 210 is exposed with respect to the gate trench GT (e.g., a vertical level of a top-most surface of the active region A1) may be higher than a level (e.g., a vertical level measured from a bottom of the substrate 210) of a portion at which the device isolation film 212 is exposed with respect to the gate trench GT (e.g., a vertical level of a top-most surface of the device isolation film 212). A bottom surface of the conductive line 230 may have a rough shape corresponding to a profile of the bottom surface of the gate trench GT. As used herein, the term "level" may refer to a height in a vertical direction (Z direction).

The gate dielectric film 220 may cover an inner surface of the gate trench GT and may contact the plurality of active regions A1 and the device isolation film 212. The gate dielectric film 220 may include a silicon oxide film, a silicon nitride film, a silicon oxynitride film, an oxide/nitride/oxide (ONO) film, or a high-k dielectric film having a higher dielectric constant than the silicon oxide film. The high-k dielectric film may have a dielectric constant of about 10 to about 25. For example, the high-k dielectric film may include $HfO_2$, $Al_2O_3$, $HfAlO_3$, $Ta_2O_3$, or $TiO_2$, but is not limited thereto.

Each of the conductive line 230 and the insulating capping pattern 270 may have a sidewall facing the active region A1. The conductive line 230 may include a metal, a metal nitride, a metal carbide, or a combination thereof. In example embodiments, the conductive line 230 may include titanium (Ti), titanium nitride (TiN), tantalum (Ta), tantalum nitride (TaN), tungsten (W), tungsten nitride (WN), titanium silicon nitride (TiSiN), tungsten silicon nitride (WSiN), or a combination thereof. The insulating capping pattern 270 may include a silicon nitride film, a silicon oxynitride film, a silicon oxide film, or a combination thereof. Source and drain regions SD may be respectively formed on opposite sides of the conductive line 230 in the plurality of active regions A1.

FIGS. 10A to 10F are cross-sectional views of a process sequence of a method of manufacturing an IC device according to embodiments. A method of manufacturing the IC device 200 shown in FIGS. 8A to 8C and 9A and 9B, according to an example embodiment, will be described with reference to FIGS. 10A to 10F.

Figure 10A:
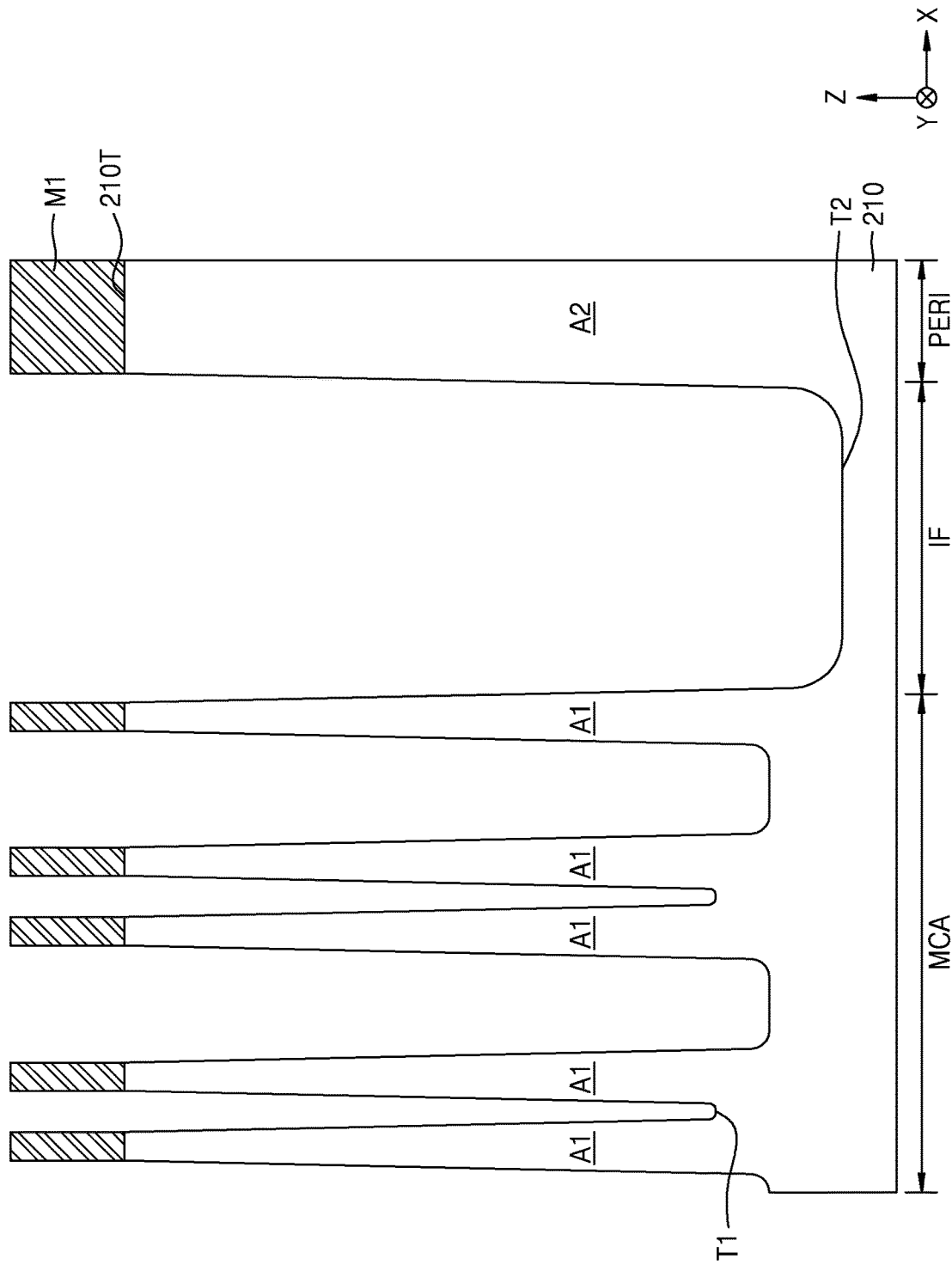
FIGS. 10A to 10F are cross-sectional views of a process sequence of a method of manufacturing an IC device according to embodiments.

Referring to FIG. 10A, a substrate 210 including the memory cell array region MCA, the interface region IF, and the peripheral circuit region PERI is prepared.

A mask pattern M1 is formed on the substrate 210, and the substrate 210 may be etched using the mask pattern M1 as an etch mask, and thus, a device isolation trench T1 is formed in the memory cell array region MCA and an interface trench T2 is formed in the interface region IF. Due to the device isolation trench T1 and the interface trench T2, a plurality of active regions A1 may be defined in the memory cell array region MCA and an active region A2 may be defined in the peripheral circuit region PERI.

The mask pattern M1 may be formed to cover a portion of the memory cell array region MCA, a portion of the interface region IF, and the peripheral circuit region PERI. The mask pattern M1 may include a hard mask including an oxide film, polysilicon, or a combination thereof.

An anisotropic dry etching process may be performed on the substrate 210 to form the device isolation trench T1 and the interface trench T2. When the substrate 210 includes silicon (Si), the anisotropic etching process may be performed using an inductively coupled plasma (ICP) etching apparatus. In example embodiments, during the anisotropic etching process, a cyclic process of repeating an oxidization process of oxidizing an exposed surface of the substrate 210 and an etching process for partially removing the substrate 210 plural times is performed.

Figure 10B:
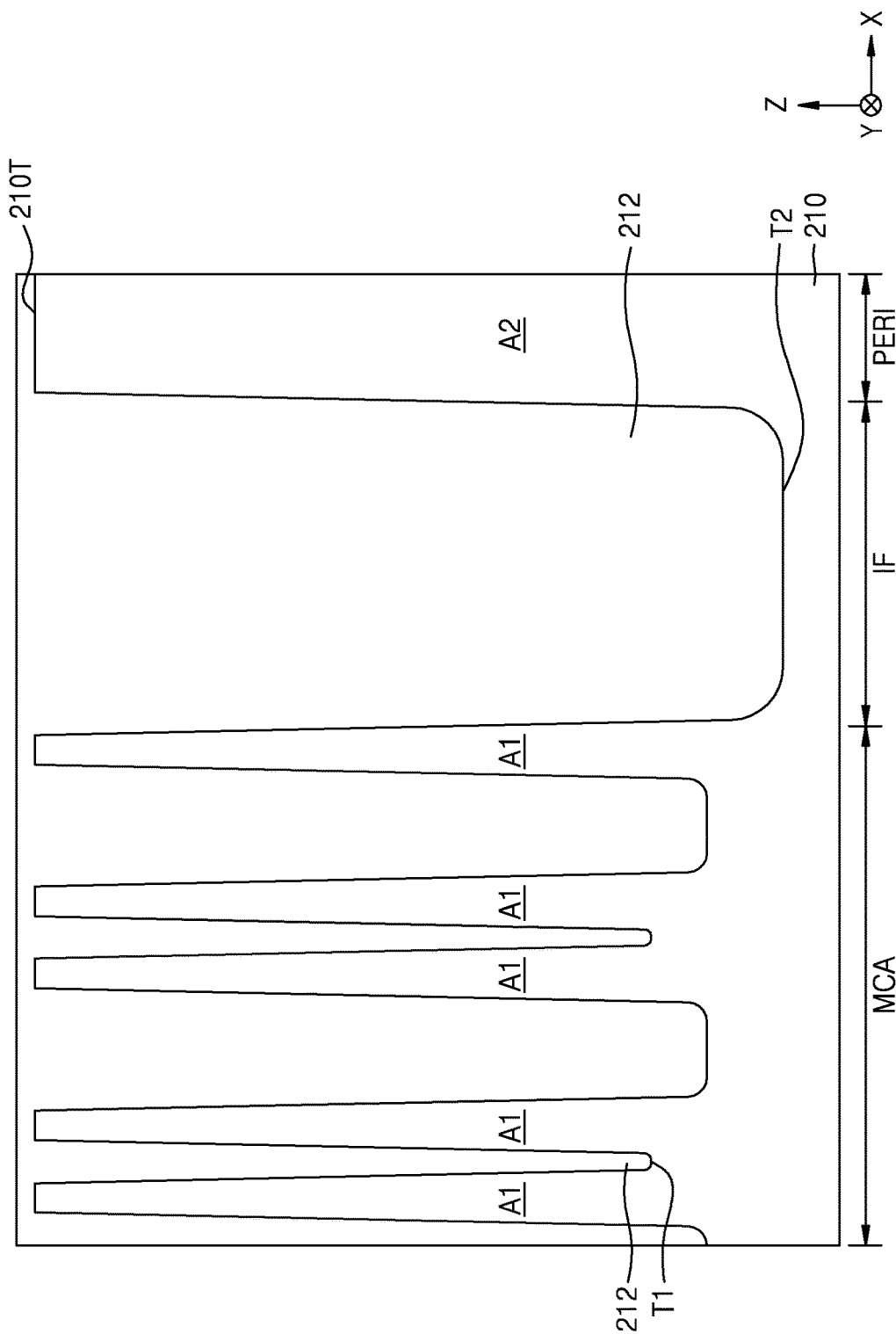

Referring to FIG. 10B, the mask pattern M1 is removed from the resultant structure of FIG. 10A, and a device isolation film 212 is formed to fill the device isolation trench T1 and the interface trench T2. The device isolation film 212 may be formed using the methods of forming the material films, which are described with reference to FIGS. 1 to 5, or any one selected from methods that are variously modified and changed within the scope of the inventive concept. The device isolation film 212 may include a silicon oxide film.

The device isolation film 212 may include a portion filling the device isolation trench T1, a portion filling the interface trench T2, and a portion covering a top surface 210T of the substrate 210. Because the device isolation film 212 is formed using the method of forming the material film according to the inventive concept, even when the device isolation film 212 is formed to simultaneously fill a narrow and deep trench structure (e.g., the device isolation trench T1 formed in the memory cell array region MCA) and a trench structure having a relatively great width (e.g., the interface trench T2) (e.g., two different trenches having two different width to depth aspect ratios), the portion of the device isolation film 212, which fills the device isolation trench T1, and the portion of the device isolation film 212, which fills the interface trench T2, may each include a high-quality insulating film having no seams or voids. When the device isolation film 212 includes a silicon oxide film, the portions of the device isolation film 212, which fill the device isolation trench T1 and the interface trench T2, may include a high-purity silicon oxide film and provide excellent electrical characteristics.

A portion of the device isolation film 212, which remains on the top surface 210T of the substrate 210, may protect the surface of the substrate 210 during a subsequent ion implantation process for implanting impurity ions into the substrate 210 or a subsequent etching process.

Figure 10C:
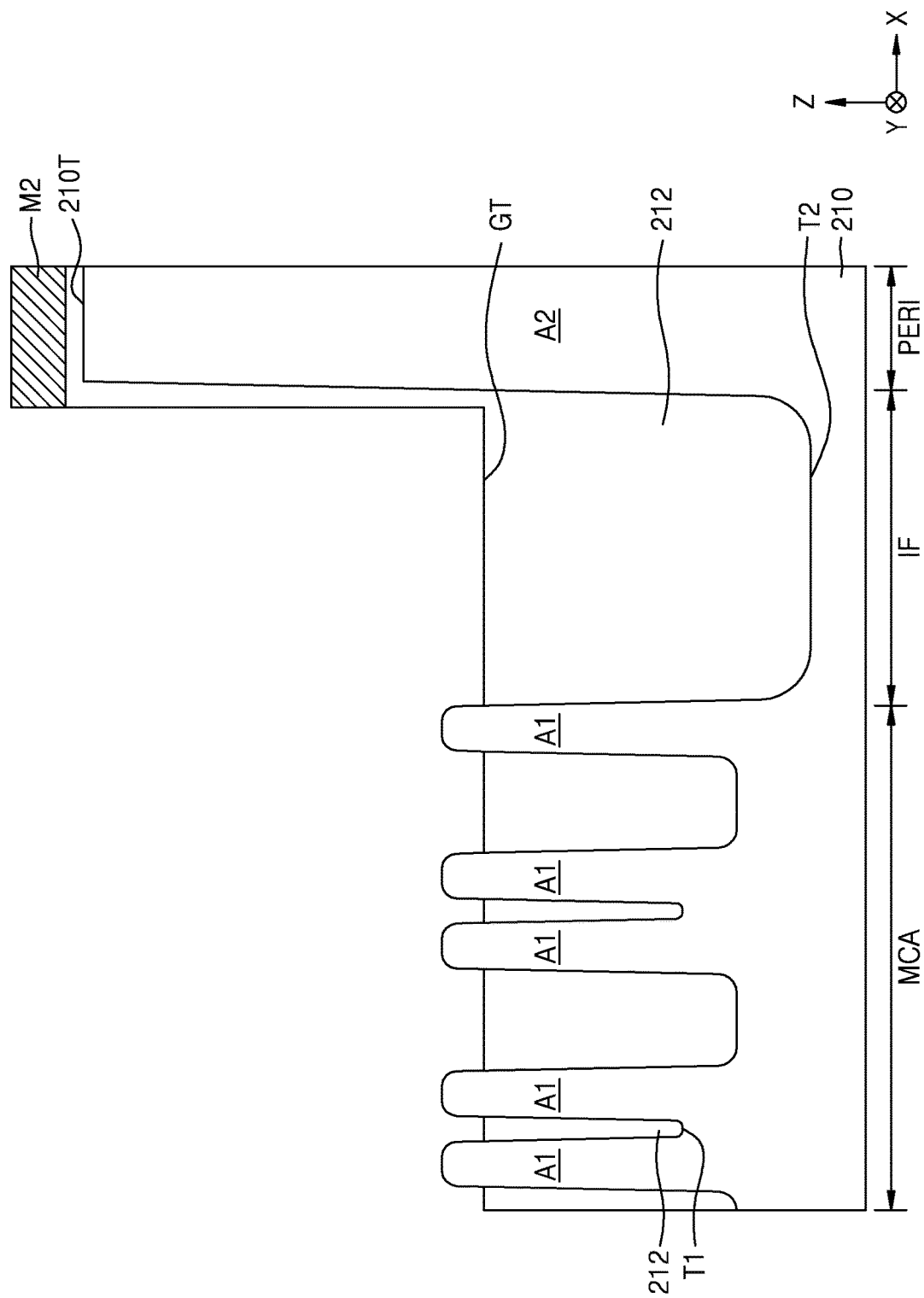

Referring to FIG. 10C, a portion of the substrate 210 and a portion of the device isolation film 212 are removed (e.g., etched) using the mask pattern M2 as an etch mask, thereby forming a gate trench GT intersecting with the plurality of active regions A1 and the device isolation film 212 and extending in a first direction (X direction).

To form the gate trench GT, a portion of each of the substrate 210 and the device isolation film 212 may be etched under a condition where an etch rate of the substrate 210 is substantially equal to an etch rate of the device isolation film 212. Subsequently, an etching process may be performed under a condition where an etch rate of the device isolation film 212 is higher than an etch rate of the substrate 210 so that a top surface of each of the plurality of active regions A1 exposed at a bottom surface of the gate trench GT may be at a higher level than a top surface of the device isolation film 212 exposed at the bottom surface of the gate trench GT. The mask pattern M2 may include an oxide film, an amorphous carbon layer (ACL), a silicon oxynitride film, or a combination thereof.

Figure 10D:
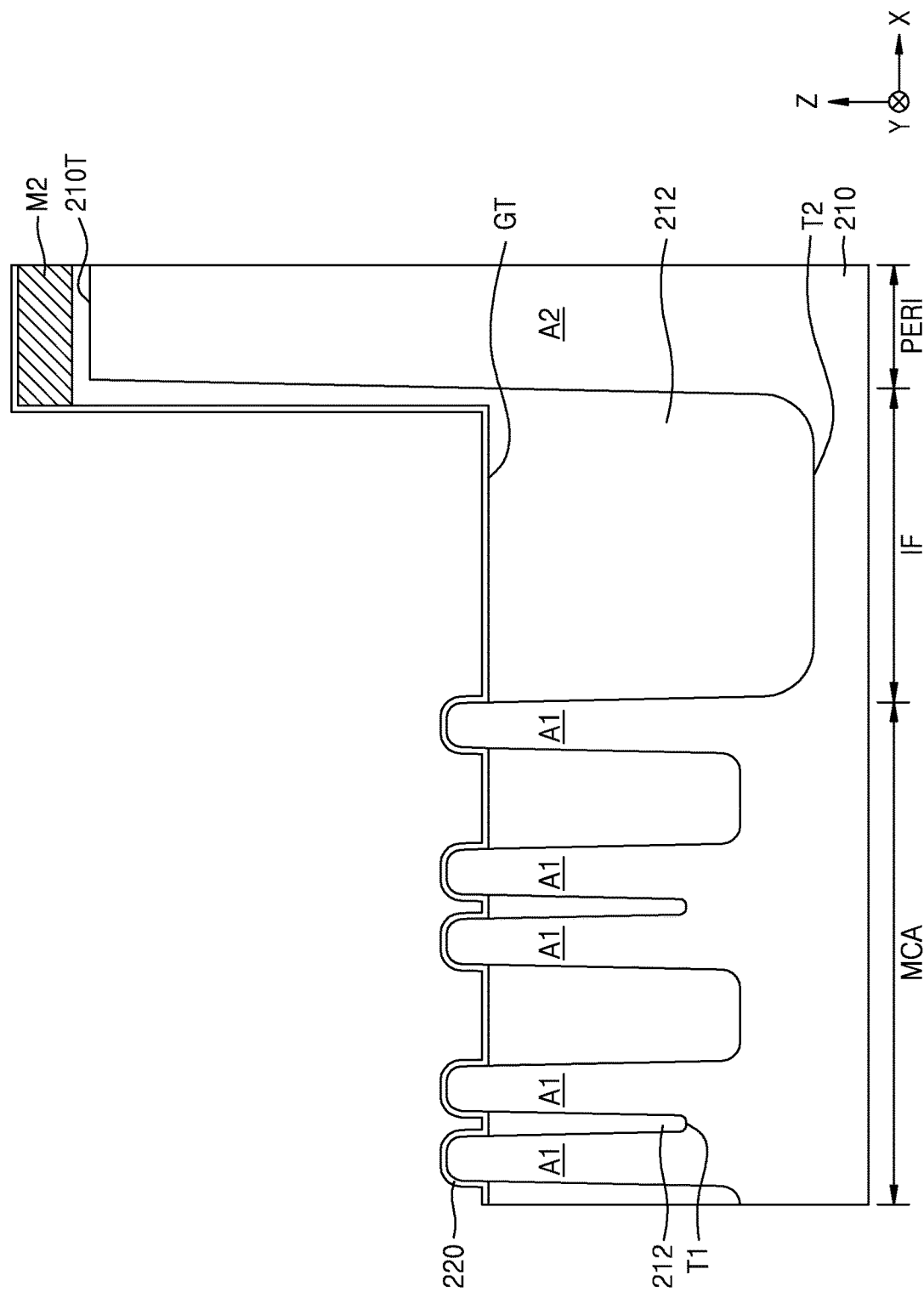

Referring to FIG. 10D, a gate dielectric film 220 is formed on the resultant structure of FIG. 10C to conformally cover an inner wall of the gate trench GT. The gate dielectric film 220 may be formed using an ALD process.

Figure 10E:
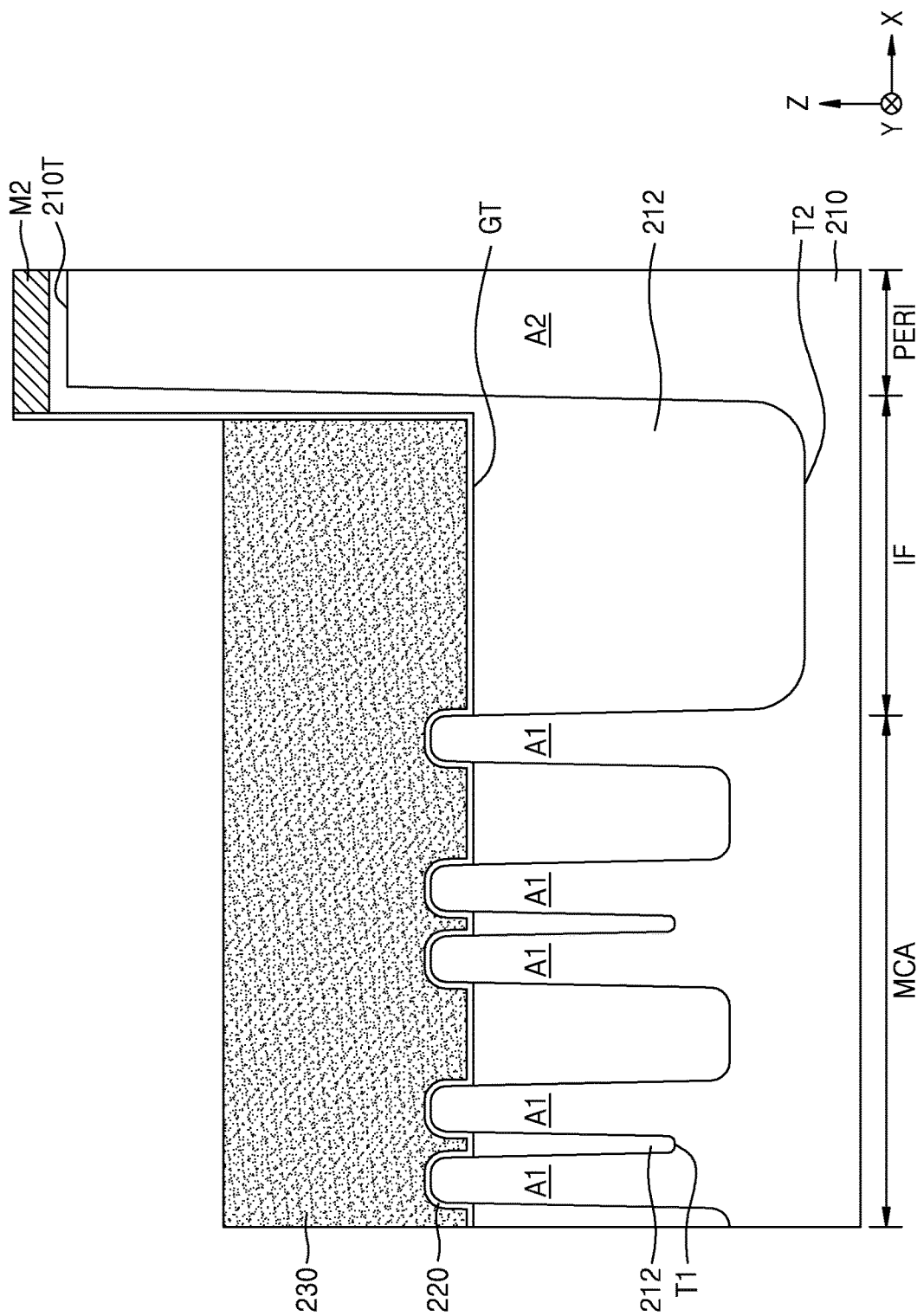

Referring to FIG. 10E, a conductive layer (not shown) may be formed on the gate dielectric film 220 to fill the gate trench GT. Thereafter, the conductive layer may be etched back to leave a conductive line 230 that partially fills the gate trench GT. While the conductive layer is being etched back to form the conductive line 230, a portion of the mask pattern M2 may be consumed to reduce a thickness of the mask pattern M2.

The conductive layer may have a structure in which a metal-containing liner and a metal film are sequentially stacked. The metal-containing liner may contact the gate dielectric film 220. The metal film may be spaced apart from the gate dielectric film 220 and surrounded by the metal-containing liner. In example embodiments, the metal-containing liner may include titanium nitride (TiN), and the metal film may include tungsten (W), but the inventive concept is not limited thereto.

Figure 10F:
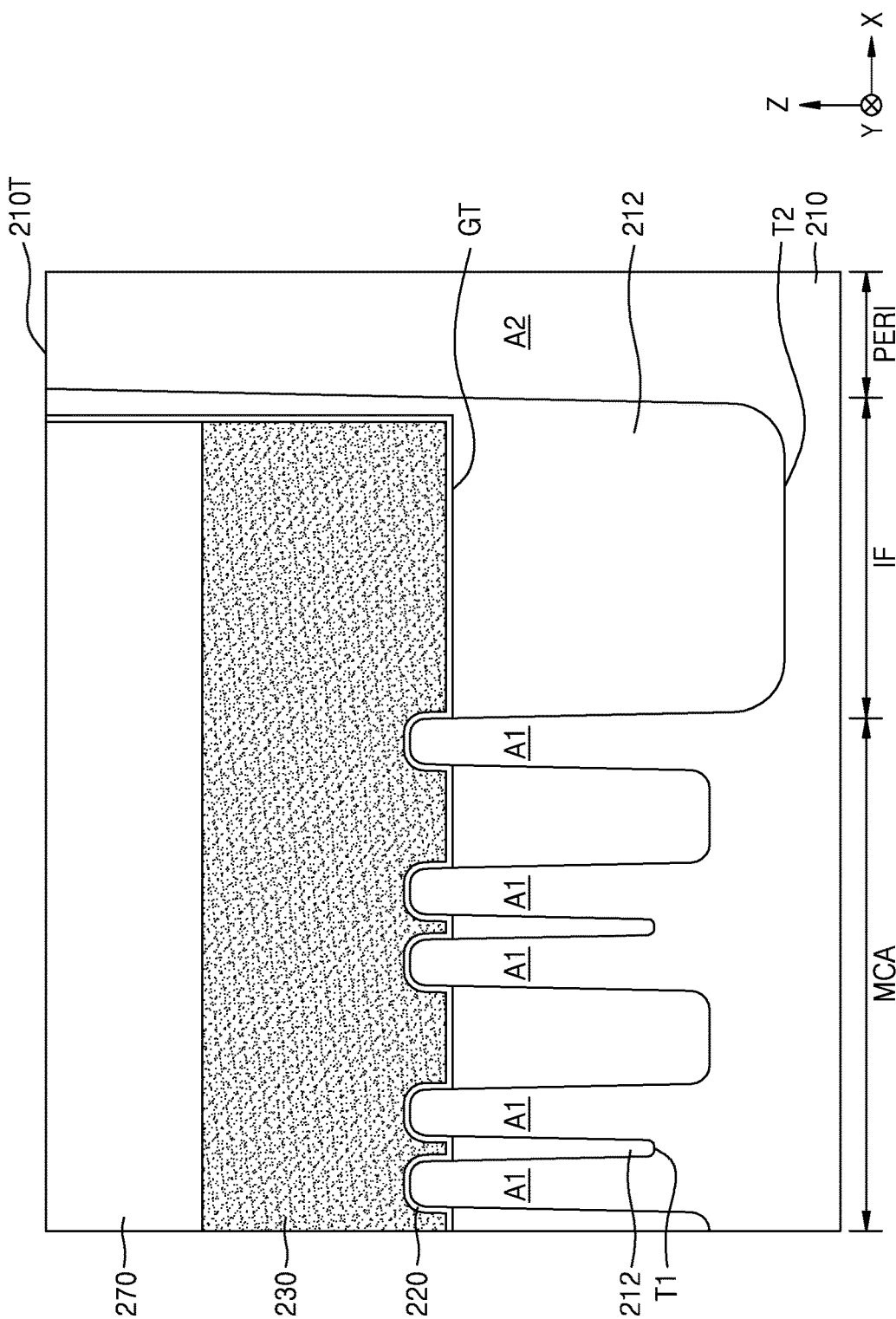

Referring to FIG. 10F, an inner space of the gate trench GT, which remains on the conductive line 230, is filled with an insulating capping pattern 270. Thereafter, the mask pattern M2, which remains on the substrate 210, is removed, and a portion of the device isolation film 212, which covers the top surface 210T of the substrate 210, may be removed to expose the top surface 210T of the substrate 210.

According to the method of manufacturing the IC device 200, which is described with reference to FIGS. 10A to 10F, when the device isolation film 212 is formed to simultaneously fill a narrow and deep trench structure (e.g., the device isolation trench T1 formed in the memory cell array region MCA) and a trench structure having a relatively great width (e.g., the interface trench T2), the device isolation trench T1 and the interface trench T2 may be filled with a high purity of the device isolation film 212 without causing seams or voids. In addition, the device isolation trench T1 formed in the memory cell array region MCA may have various widths in a lateral direction (e.g., the X direction or a Y direction). When the device isolation film 212 is formed to fill the device isolation trench T1 having the various widths, the inside of the device isolation trench T1 may be filled with a high purity of the device isolation film 212 without causing seams or voids regardless of the various widths of the device isolation trench T1.

Furthermore, according to the method of manufacturing the IC device 200, which is described with reference to FIGS. 10A to 10F, it may not be necessary to perform a separate etching process or use a separate inhibitor for each ALD cycle to reduce a deposition rate at which the device isolation film 212 is formed on an entrance side of each of the device isolation trench T1 and the interface trench T2. Thus, it may be possible to fundamentally prevent problems, such as the likelihood of contamination due to the etching process or the use of the inhibitor or the adverse influence of the etching process or the inhibitor upon electrical characteristics. Accordingly, the device isolation trench T1 and the interface trench T2, which have various widths, may be filled with the device isolation film 212 without causing seams or voids by using a relatively simple process. Also, because the insulating film included in the device isolation film 212 has a high purity, electrical characteristics of the IC device 200 may be improved.

While the inventive concept has been particularly shown and described with reference to embodiments thereof, it will be understood that various changes in form and details may be made therein without departing from the spirit and scope of the following claims.

We claim:

1. A method of forming a material film, the method comprising:
   supplying a first precursor comprising a first central element and a first ligand having a first size onto a lower structure and forming a first chemisorbed layer of the first precursor on the lower structure;
   supplying a second precursor comprising a second central element and a second ligand having a second size onto a resultant structure in which the first chemisorbed layer is formed, and forming a second chemisorbed layer of the second precursor on the lower structure, wherein the second size is less than the first size; and
   forming a material film comprising the first central element and the second central element by supplying a reactive gas to the first chemisorbed layer and the second chemisorbed layer to remove the first ligand and the second ligand from the lower structure,
   wherein each of the first central element and the second central element is a semiconductor element.

2. The method of claim 1, wherein each of the first central element and the second central element is silicon (Si).

3. The method of claim 1, wherein a first molecular weight of the first precursor is greater than a second molecular weight of the second precursor.

4. The method of claim 1, wherein the first ligand comprises an aromatic functional group, an alkoxy functional group, a thiol functional group, or a —Si—(CH$_2$)$_n$—Si— group, wherein n is an integer ranging from 1 to 5.

5. The method of claim 1, wherein the reactive gas comprises an oxidizing gas or a reducing gas.

6. The method of claim 1, further comprising treating the material film using hydrogen plasma.

7. The method of claim 1, wherein the material film is part of an integrated circuit (IC) device, and the method is a method of forming the IC device, the IC device including a lower structure having a step structure defining a trench, wherein the material film is formed inside the trench, and
wherein the forming of the material film comprises performing an atomic layer deposition (ALD) cycle at least once.

8. A method of manufacturing an integrated circuit (IC) device, the method comprising:
preparing a lower structure for the IC device, the lower structure having a step structure defining a trench; and
forming a material film inside the trench,
wherein the forming of the material film comprises performing an atomic layer deposition (ALD) cycle at least once, the ALD cycle comprising:
a first process of supplying a first precursor comprising a first central element and a first ligand having a first size into the trench and forming a first chemisorbed layer of the first precursor inside the trench;
a second process of supplying a second precursor comprising a second central element and a second ligand having a second size into the trench in which the first chemisorbed layer is formed, and forming a second chemisorbed layer of the second precursor inside the trench, wherein the second size is less than the first size; and
a third process of forming an atomic-level material film comprising the first central element and the second central element inside the trench by supplying a reactive gas to the first chemisorbed layer and the second chemisorbed layer.

9. The method of claim 8, wherein the ALD cycle further comprises a fourth process of treating the atomic-level material film using hydrogen plasma after the third process is performed.

10. The method of claim 8, wherein the forming of the material film further comprises treating the atomic-level material film using hydrogen plasma after the ALD cycle is performed plural times.

11. The method of claim 8, wherein the material film is a silicon oxide film, and
each of the first central element and the second central element is a silicon (Si) atom.

12. The method of claim 8, wherein the material film is a silicon oxide film,
the first ligand comprises an aromatic functional group, an alkoxy functional group, a thiol functional group, or a —Si—(CH$_2$)$_n$—Si— group, and
the second ligand does not include the aromatic functional group, the alkoxy functional group, the thiol functional group, or the —Si—(CH$_2$)$_n$—Si— group,
wherein n is an integer ranging from 1 to 5.

13. The method of claim 8, wherein the material film is a silicon oxide film, and
the second precursor comprises silane (SiH$_4$), disilane (Si$_2$H$_6$), silane substituted with halogen, organic silane, or organic aminosilane.

14. An integrated circuit (IC) device manufactured using the method of claim 8,
wherein the material film comprises a silicon oxide film,
wherein an upper portion of the silicon oxide film, which is relatively close to an entrance of the trench, comprises carbon atoms at a first content, and
a lower portion of the silicon oxide film, which is relatively close to a bottom surface of the trench, comprises carbon atoms at a second content lower than the first content.

15. A method of manufacturing an integrated circuit (IC) device, the method comprising:
forming a trench defining an active region in a substrate; and
forming a silicon oxide film inside the trench,
wherein the forming of the silicon oxide film comprises performing an atomic layer deposition (ALD) cycle at least once, the ALD cycle comprising:
a first process of supplying a first precursor comprising a first silicon central element and a first ligand having a first size into the trench and forming a first chemisorbed layer of the first precursor inside the trench;
a second process of supplying a second precursor comprising a second silicon central element and a second ligand having a second size into the trench in which the first chemisorbed layer is formed, and forming a second chemisorbed layer of the second precursor inside the trench, wherein the second size is less than the first size; and
a third process of forming an atomic-level silicon oxide film inside the trench by supplying an oxidizing gas to the first chemisorbed layer and the second chemisorbed layer.

16. The method of claim 15, wherein the first ligand comprises an aromatic functional group, an alkoxy functional group, a thiol functional group, or a —Si—(CH$_2$)$_n$—Si— group, and
wherein the second ligand does not comprise the aromatic functional group, the alkoxy functional group, the thiol functional group, or the —Si—(CH$_2$)$_n$—Si— group,
wherein n is an integer ranging from 1 to 5.

17. The method of claim 15, wherein a first molecular weight of the first precursor is greater than a second molecular weight of the second precursor.

18. The method of claim 15, wherein the ALD cycle further comprises a fourth process of treating the atomic-level silicon oxide film using hydrogen plasma after the third process is performed.

19. The method of claim 15, wherein the forming of the silicon oxide film further comprises treating the atomic-level silicon oxide film using hydrogen plasma after the ALD cycle is performed plural times.

20. An integrated circuit (IC) device manufactured using the method of claim 15, wherein the silicon oxide film has a carbon atom content of less than 3 atomic percent (at %),
wherein an upper portion of the silicon oxide film, which is relatively close to an entrance of the trench, comprises carbon atoms at a first content that is selected in the range of more than 0 at % and less than 3 at %, and
wherein a lower portion of the silicon oxide film, which is relatively close to a bottom surface of the trench, comprises carbon atoms at a second content that is selected in the range of more than or equal to 0 at % and less than 3 at %, and the second content is lower than the first content.

* * * * *